(12) United States Patent
Takahashi et al.

(10) Patent No.: US 11,309,348 B2
(45) Date of Patent: Apr. 19, 2022

(54) HIGH DENSITY IMAGE SENSOR

(71) Applicant: Taiwan Semiconductor Manufacturing Co., Ltd., Hsin-Chu (TW)

(72) Inventors: Seiji Takahashi, Hsinchu (TW); Chen-Jong Wang, Hsin-Chu (TW); Dun-Nian Yaung, Taipei (TW); Jhy-Jyi Sze, Hsin-Chu (TW); Yimin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 76 days.

(21) Appl. No.: 16/567,210

(22) Filed: Sep. 11, 2019

(65) Prior Publication Data

US 2021/0074758 A1 Mar. 11, 2021

(51) Int. Cl.
*H01L 27/146* (2006.01)
*H04N 5/374* (2011.01)

(52) U.S. Cl.
CPC .... *H01L 27/14654* (2013.01); *H01L 27/1461* (2013.01); *H01L 27/14603* (2013.01); *H01L 27/14614* (2013.01); *H01L 27/14689* (2013.01); *H04N 5/374* (2013.01)

(58) Field of Classification Search
CPC ......... H01L 27/14654; H01L 27/14603; H01L 27/1461; H01L 27/14614; H01L 27/14689; H01L 27/146; H04N 5/374
See application file for complete search history.

(56) References Cited

U.S. PATENT DOCUMENTS

| 9,659,987 | B2 | 5/2017 | Wang et al. | |
|---|---|---|---|---|
| 9,735,197 | B1* | 8/2017 | Kwag | H01L 27/14616 |
| 2010/0314672 | A1* | 12/2010 | Manda | H01L 29/7813 |
| | | | | 257/292 |
| 2011/0187911 | A1* | 8/2011 | Shinohara | H01L 27/14641 |
| | | | | 348/308 |

(Continued)

OTHER PUBLICATIONS

Stefanov et al. "Design and Performance of a Pinned Photodiode CMOS Image Sensor Using Reverse Substrate Bias." Sensors 2018, 18, 118, published Jan. 3, 2018.

*Primary Examiner* — Sheng-Bai Zhu
(74) *Attorney, Agent, or Firm* — Eschweiler & Potashnik, LLC

(57) ABSTRACT

The present disclosure relates to a CMOS image sensor having a doped isolation structure separating a photodiode and a pixel device, and an associated method of formation. In some embodiments, the CMOS image sensor has a doped isolation structure separating a photodiode and a pixel device. The photodiode is arranged within the substrate away from a front-side of the substrate. A pixel device is disposed at the front-side of the substrate overlying the photodiode and is separated from the photodiode by the doped isolation structure. Comparing to previous image sensor designs, where an upper portion of the photodiode is commonly arranged at a top surface of a front-side of the substrate, now the photodiode is arranged away from the top surface and leaves more room for pixel devices. Thus, a larger pixel device can be arranged in the sensing pixel, and short channel effect and noise level can be improved.

20 Claims, 21 Drawing Sheets

(56) References Cited

U.S. PATENT DOCUMENTS

| | | | |
|---|---|---|---|
| 2012/0217601 A1* | 8/2012 | Miyanami | H01L 27/14623 257/432 |
| 2014/0077271 A1* | 3/2014 | Fujii | H01L 27/14609 257/239 |
| 2015/0001376 A1* | 1/2015 | Miyanami | H01L 27/14614 250/208.1 |
| 2015/0108555 A1* | 4/2015 | Jung | H01L 21/26586 257/290 |
| 2016/0086984 A1* | 3/2016 | Wang | H01L 27/14643 257/292 |
| 2018/0083057 A1* | 3/2018 | Crocherie | H01L 27/14636 |
| 2018/0315787 A1* | 11/2018 | Ito | H01L 27/14689 |

* cited by examiner

HIGH DENSITY IMAGE SENSOR

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used to provide a color and brightness signal for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
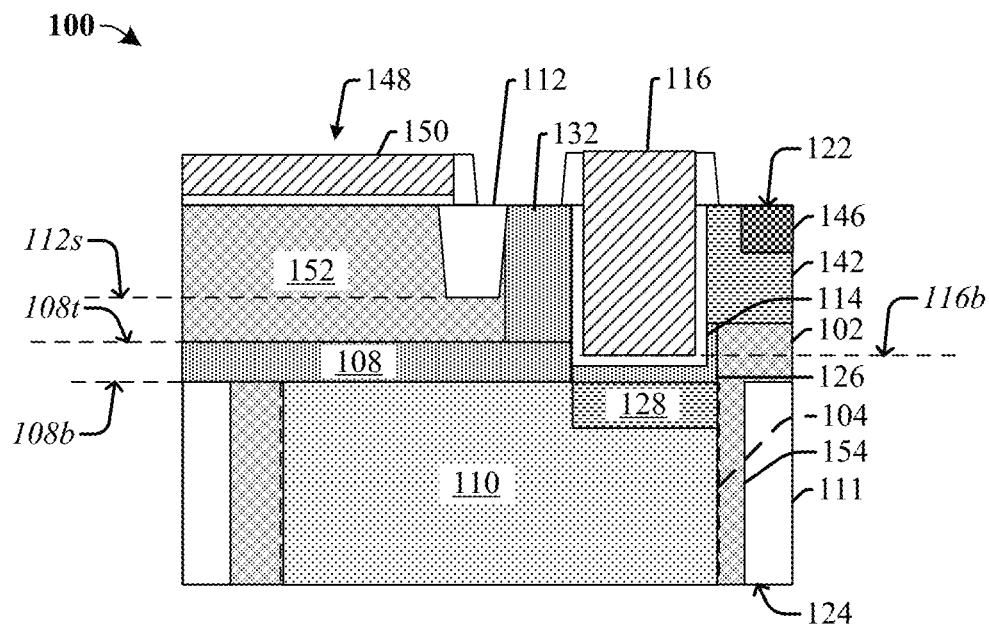
FIG. 1 illustrates a cross-sectional view of a CMOS image sensor having a doped isolation structure separating a photodiode and a pixel device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are frequently being improved by scaling down device geometries to achieve lower fabrication costs, higher device integration density, higher speeds, and better performance. However, due to device scaling, sensing pixels of the image sensor have smaller dimensions and are closer to one another, and thus cause degradation of pixel performance characters such as pixel noise, charge transfer capability, and full well capacity. It becomes challenging to use conventional pixel layout and structure and achieve good pixel performance due to limited available area.

The present disclosure relates to a CMOS image sensor comprising an improved sensing pixel structure, and an associated method of formation. The CMOS image sensor has a doped isolation structure separating a photodiode and a pixel device. The photodiode is arranged within the substrate away from a front-side of the substrate. A pixel device is disposed at the front-side of the substrate overlying the photodiode and is separated from the photodiode by the doped isolation structure. Comparing to previous image sensor designs, where an upper portion of the photodiode is commonly arranged at a top surface of a front-side of the substrate, now the photodiode is arranged away from the top surface and leaves more room for pixel devices. Thus, a larger pixel device can be arranged in the sensing pixel, and short channel effect and noise level can be improved.

Figure 2:
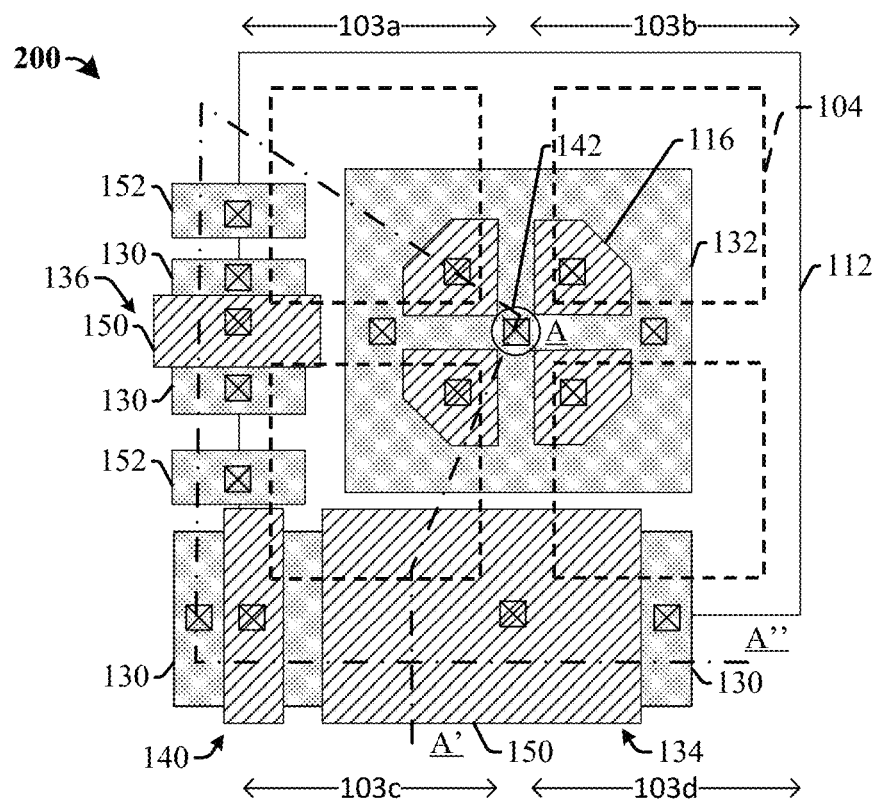
FIG. 2 illustrates a layout view of a 2×2 pixel area of a CMOS image sensor according to some embodiments.

FIG. 1 illustrates a cross-sectional view 100 of a CMOS image sensor having a pixel device 148 overlying a photodiode 104 according to some embodiments. A doped vertical isolation region 132 and a doped lateral isolation region 108 collectively function as a doped isolation structure and separate the pixel device 148 and the photodiode 104. In some embodiments, as shown in FIG. 2, the CMOS image sensor comprises a substrate 102 having a front-side 122 and a back-side 124. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. As an example, the substrate 102 may have a depth in a range of from about 2 μm to about 10 μm. A photodiode doped region 110 is disposed within the substrate 102 and surrounded by a photodiode well region 154 of the substrate 102. The photodiode doped region 110 and the substrate 102 may meet at an interface of a P-N junction and configured to convert a radiation to an electrical signal.

A vertical transfer gate electrode 116 is disposed from the front-side 122 of the substrate 102 to a bottom surface 116b of the vertical transfer gate electrode 116 within the substrate 102. The vertical transfer gate electrode 116 is separated from the substrate 102 by a gate dielectric 114. In some embodiments, the gate dielectric 114 abuts sidewalls of the doped vertical isolation region 132 and the doped lateral isolation region 108. The bottom surface 116b may locate at a first position vertically between a top surface 108t and a bottom surface 108b of the doped lateral isolation region 108.

A floating diffusion well 142 is disposed within the substrate 102 on another side of the vertical transfer gate electrode 116 opposite to the doped vertical isolation region 132. In some embodiments, the doped vertical isolation region 132 surrounds around the vertical transfer gate electrode 116 and has its sidewall directly meet sidewall of the floating diffusion well 142. Varies contacts can be arranged on corresponding device structures. For example, a floating diffusion contact 146 can be disposed on an upper surface of the floating diffusion well 142.

A pixel device well 152 is disposed on the doped lateral isolation region 108. The pixel device well 152 may be separated from the photodiode doped region 110 by the doped lateral isolation region 108. A shallow trench isolation (STI) structure 112 is disposed within the pixel device well 152 from the front-side 122 of the substrate 102 to a bottom surface 112s within the pixel device well 152. The bottom surface 112s of the STI structure 112 may locate at a position vertically closer to the front-side 122 of the substrate 102 than the top surface 108t of the doped lateral isolation region 108. As an example, the STI structures 112 may have a depth in a range of from about 50 nm to about 500 nm. In some embodiments, the STI structures 112 comprises a dielectric fill layer (e.g., an oxide layer). The pixel device 148 is disposed at the front-side 122 of the substrate 102 within the pixel device well 152 and directly overlying the photodiode doped region 110. The pixel device 148 comprises a gate electrode 150 disposed over the substrate 102 and a pair of source/drain (S/D) regions (not shown) disposed within the substrate 102.

A deep trench isolation (DTI) structure 111 is disposed in the substrate 102, extending from the back-side 124 to a position within the substrate 102. In some embodiments, the DTI structure 111 has a top surface sharing a common plane with a top surface of the photodiode doped region 110 and the bottom surface 108b of the doped lateral isolation region 108. The DTI structure 111 and the photodiode doped region 110 may have depths substantially equal to one another. As an example, the DTI structure 111 and the photodiode doped region 110 may respectively have a depth in a range of from about 2 μm to about 10 μm. In some embodiments, the DTI structure 111 comprises a dielectric fill layer (e.g., an oxide layer).

In some embodiments, the doped lateral isolation region 108 abuts a top surface of the photodiode doped region 110, may also function as a pinned implant layer for the photodiode doped region and block dark current from silicon surface. The doped lateral isolation region 108 may be heavily doped (e.g. having a resistivity down in the range of milliOhm/cm).

FIG. 2 illustrates a layout view 200 of a 2×2 pixel area of a CMOS image sensor according to some embodiments. The term "pixel" refers to a unit cell containing features (for example, a photodetector and various circuitries, which may include various semiconductor devices) for converting electromagnetic radiation to an electrical signal. In the depicted embodiment, each pixel may include a photodetector, such as a photogate-type photodetector, for recording an intensity or brightness of light (radiation). Each pixel may also include various semiconductor devices, such as various transistors including a transfer transistor, a reset transistor, a source-follower transistor, a select transistor, another suitable transistor, or combinations thereof. Additional circuitry, input, and/or output may be coupled to the pixel array to provide an operating environment for the pixels and support external communications with the pixels. For example, the pixel array may be coupled with readout circuitry and/or control circuitry. As an example, the sensing pixel 103 may have a size in a range of from about 0.5 μm to about 10 μm. If not stated otherwise, the dimension examples hereafter are all based on such a pixel size. FIG. 1 can be described as a cross-sectional view along a line A-A' of FIG. 2, but it is appreciated that some features shown in FIG. 1 can also be independent and thus is not limited by the features shown in FIG. 2. As shown in FIG. 2, four sensing pixels 103a, 103b, 103c, 103d may share one floating diffusion well 142 and one set of pixel devices (presented as the pixel device 148 in FIG. 1). The pixel devices may be a source follower transistor 134, a reset transistor 136, or a row select transistor 140, and may respectively comprise a gate electrode 150 disposed over the pixel device well 152 and a pair of source/drain (S/D) regions 130 disposed within the pixel device well 152. The vertical transfer gate electrode 116 may have a pentagon shape from the layout view. The vertical transfer gate electrode 116 may also be other polygan shapes. Varies contacts can be arranged on corresponding device structures. Example contacts are illustrated by an "X" disposed in a box. The STI structure 112 is disposed at a peripheral region of the sensing pixels 103a, 103b, 103c, 103d.

Figure 3:
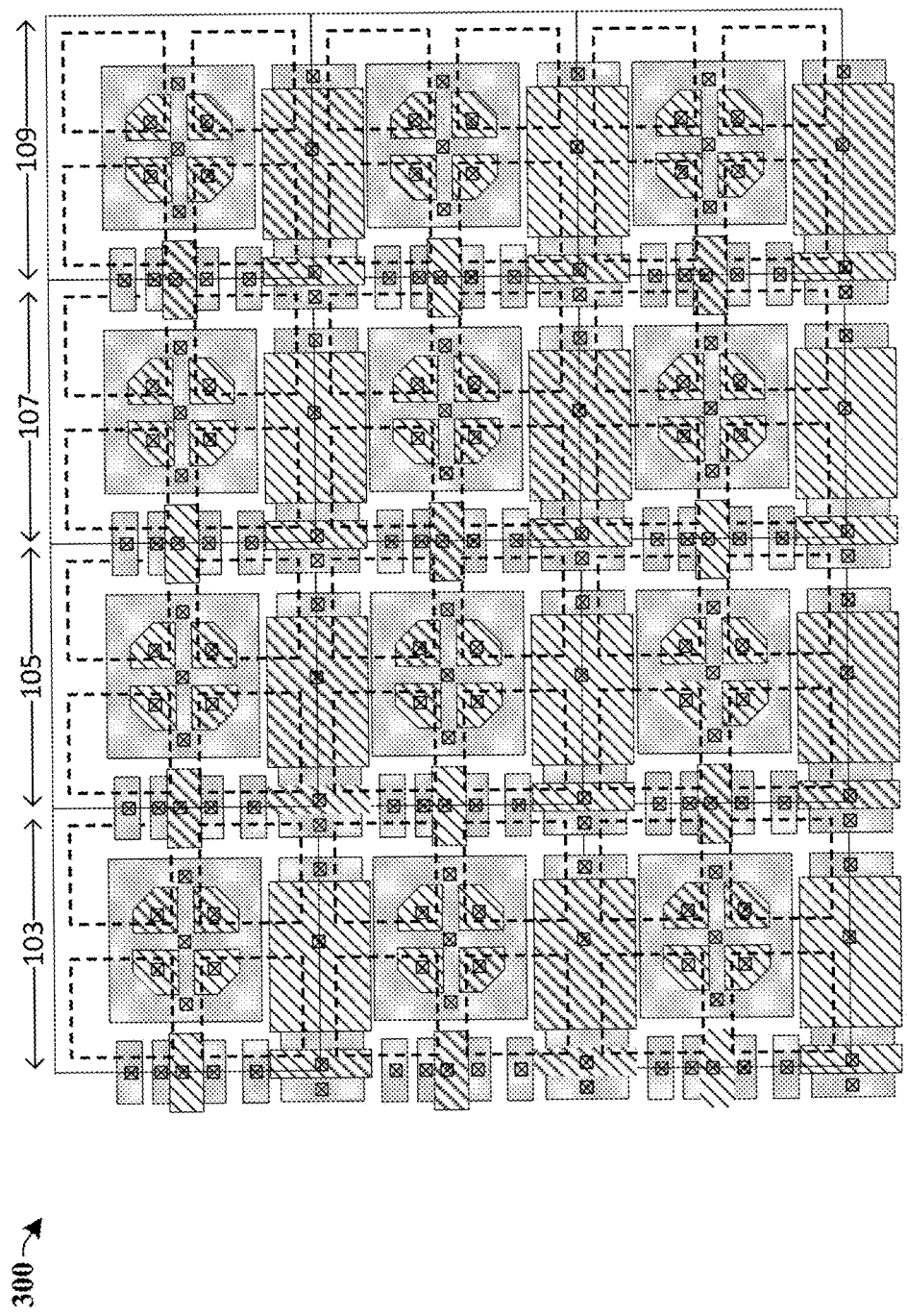
FIG. 3 illustrates a layout view of a sensing array made of an array of repeated 2×2 pixel areas according to some embodiments.

FIG. 3 illustrates a layout view 300 of a sensing array made of an array of repeated 2×2 pixel areas according to some embodiments. The sensing pixels 103a, 103b, 103c, 103d and corresponding circuitries may constitute a sensing pixel 103. The sensing unit may be repeated and expanded in rows as sensing units 105, 107, and 109 as examples and also be repeated and expanded in columns.

Figure 4:
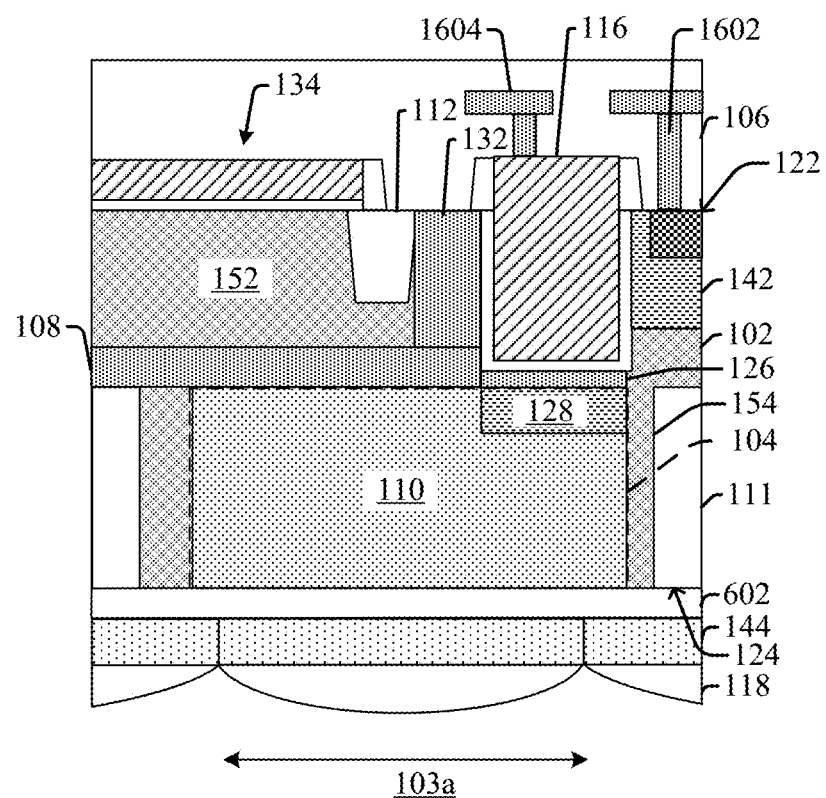
FIG. 4 illustrates a cross-sectional view of a CMOS image sensor having a doped isolation structure separating a photodiode and a pixel device according to some embodiments.

FIG. 4 illustrates a cross-sectional view 400 of a sensing pixel 103a CMOS image sensor having a doped isolation structure separating a photodiode and a pixel device according to some embodiments. The photodiode 104 may comprise the photodiode doped region 110 disposed within the photodiode well region 154 of the substrate 102. A floating diffusion well 142 is disposed within the substrate 102 aside of the photodiode 104. The vertical transfer gate electrode 116 is disposed into the substrate 102 between the floating diffusion well 142 and the photodiode doped region. The photodiode doped region 110 and the substrate 102 may be in contact with each other and form a P-N junction at a meeting interface The photodiode doped region 110 may be disposed underneath the vertical transfer gate electrode 116. A top surface of the photodiode doped region 110 may be further away from the front-side 122 of the substrate than a bottom surface of the vertical transfer gate electrode 116. At a peripheral region of the sensing pixel 103a away from the floating diffusion well 142, the STI structure 112 is disposed overlying the photodiode doped region 110 and the vertical transfer gate electrode 116. The doped vertical isolation region 132 is disposed between the STI structure 112 and the vertical transfer gate electrode 116. The pixel device 148 is disposed outside of the STI structure 112 on the pixel device well 152. The doped vertical isolation region 132 separates the vertical transfer gate electrode 116 from the pixel device well 152. In some embodiments, the pixel device well 152 covers the entire bottom surface of the STI structure 112.

A plurality of color filters 144 are arranged over the back-side 124 of the substrate 102. The plurality of color filters 144 are respectively configured to transmit specific wavelengths of incident radiation or incident light 120. For example, a first color filter (e.g., a red color filter) may transmit light having wavelengths within a first range, while a second color filter may transmit light having wavelengths within a second range different than the first range. In some embodiments, the plurality of color filters 144 may be arranged within a grid structure overlying the substrate 102. In some embodiments, the grid structure may comprise a dielectric material.

In some embodiments, an anti-reflection layer 602 is disposed between the color filters 144 and the substrate 102.

In some embodiments, the anti-reflection layer 602 may comprise oxide, nitride, high-k dielectric material such as aluminum oxide (AlO), tantalum oxide (TaO), hafnium oxide (HfO), hafnium silicon oxide (HfSiO), hafnium aluminum oxide (HfAlO), or hafnium tantalum oxide (HMO), or the combination thereof, for example. A plurality of micro-lenses 118 may be arranged over the plurality of color filters 144. Respective micro-lenses 118 are aligned with the color filters 144 and overlie the sensing pixel 103. In some embodiments, the plurality of micro-lenses 118 have a substantially flat bottom surface abutting the plurality of color filters 144 and a curved upper surface. The curved upper surface is configured to focus the incident radiation or incident light 120 (e.g., light towards the underlying sensing pixel 103. During operation of the CMOS image sensor, the incident radiation or incident light 120 is focused by the micro-lens 118 to the underlying sensing pixel 103. When incident radiation or incident light of sufficient energy strikes the photodiode 104, it generates an electron-hole pair that produces a photocurrent. Notably, though the micro-lenses 118 is shown as fixing onto the image sensor in FIG. 6A, it is appreciated that the image sensor may not include micro-lens, and the micro-lens may be attached to the image sensor later in a separate manufacture activity.

In some embodiments, a back-end-of-the-line (BEOL) metallization stack can be arranged on the front-side 122 of the substrate 102. The BEOL metallization stack comprises a plurality of metal interconnect layers arranged within one or more inter-level dielectric (ILD) layers 106. The ILD layers 106 may comprise one or more of a low-k dielectric layer (i.e., a dielectric with a dielectric constant less than about 3.9), an ultra low-k dielectric layer, or an oxide (e.g., silicon oxide). Conductive contacts 1602 are arranged within the ILD layers 106. The conductive contacts 1602 extend from the transfer gate electrode 116 and the floating diffusion well 142 to one or more metal wire layers 1604. In various embodiments, the conductive contacts 1602 may comprise a conductive metal such as copper or tungsten, for example.

The doped lateral isolation region 108 may be disposed underneath the pixel device well 152 and may cover the entire bottom surface of the pixel device well 152. The photodiode doped region 110 and the DTI structure 111 are disposed directly under the doped lateral isolation region 108. The doped lateral isolation region 108 may cover a top surface of the photodiode doped region 110 and function as a pinning layer and be partly non-depleted to make a large P-N junction capacitance. The doped lateral isolation region 108 may also act to isolate the photodiode and the pixel device, and moreover to block dark current from silicon surface.

Figure 5:
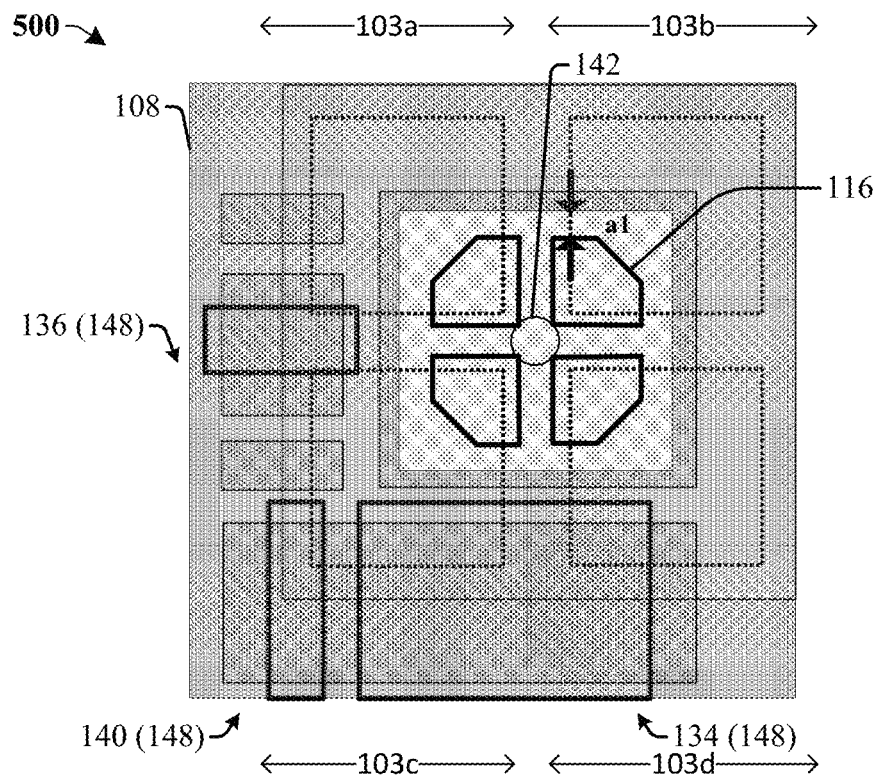
FIG. 5 illustrates a layout view of a 2×2 pixel area of a CMOS image sensor according to some embodiments.
Figure 6:
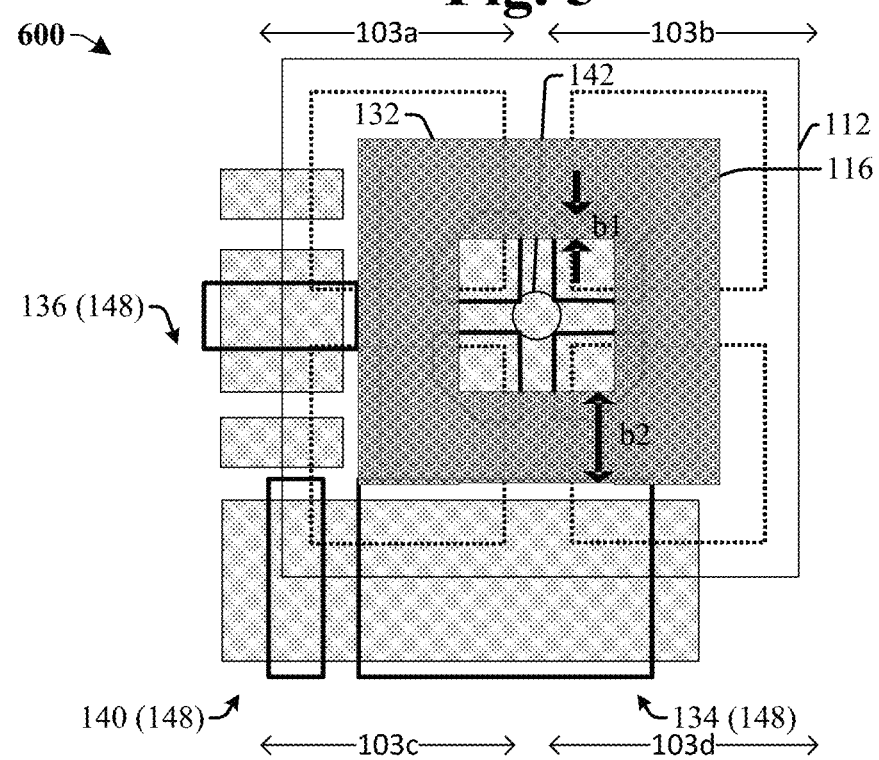
FIG. 6 illustrates a layout view of a 2×2 pixel area of a CMOS image sensor according to some embodiments.

FIG. 5 illustrates a layout view 500 of a 2×2 pixel area of a CMOS image sensor according to some embodiments specifically showing the lateral coverage of the doped lateral isolation region 108. FIG. 6 illustrates a layout view 600 of a 2×2 pixel area of a CMOS image sensor according to some embodiments specifically showing the lateral coverage of the doped vertical isolation region 132. As shown in FIG. 5, the doped lateral isolation region 108 surrounds a peripheral region of the four sensing pixels 103a, 103b, 103c, 103d and extends to laterally overlap with the pixel devices 148 such as the source follower transistor 134, the reset transistor 136, and the row select transistor 140. An example of the CMOS image sensor of more detailed descriptions is described above with reference to FIG. 1 and FIG. 2. In some embodiments, the doped lateral isolation region 108 can be heavily doped by a p-type dopant. The p-type doping concentration may be in a range of from about 1e17 to about 1e19/cm³. In some embodiments, the doped lateral isolation region 108 also functions as a pinning layer, which is partly non-depleted to make a large pn-junction capacitance, and acts to isolate the photodiode doped region 110 (n-type) and pixel devices 148 (e.g. n-type), and moreover to block dark current from silicon surface. A distance between the doped lateral isolation region 108 and the vertical transfer gate electrode 116 is in the range of from about −50 nm (overlapping) to about 250 nm.

As shown in FIG. 6, the doped vertical isolation region 132 surrounds a sidewall of the vertical transfer gate electrode 116 and leaves out one side of the floating diffusion well 142. The vertical transfer gate electrode 116 may have an upper portion above the front-side 122 of the substrate wider than the a lower portion below the front-side 122 of the substrate 102 (see an exemplary cross-sectional view in FIG. 1). The doped vertical isolation region 132 abuts the sidewall of the lower portion and thus may be disposed underneath the upper portion and laterally overlap with a boundary portion of the top portion as shown by FIG. 6. The doped vertical isolation region 132 may be heavily doped with a p-type dopant and may has a junction depth nearly equal to or larger than the vertical transfer gate depth. The p-type doping concentration is substantially in the range of 1e17 to 1e19/cm³. The width may be at least around 50 nm.

Figure 7:
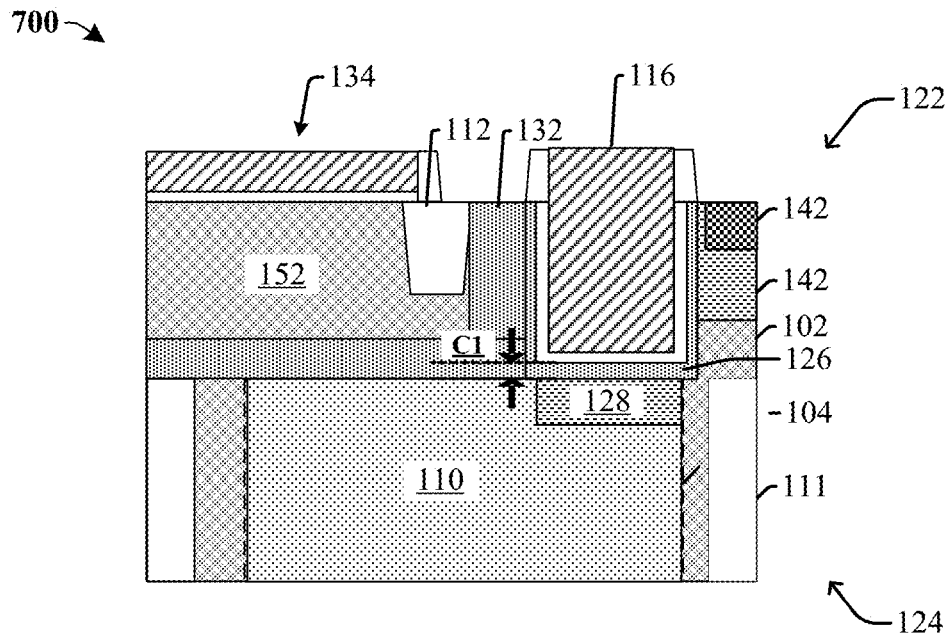
FIG. 7 illustrates a cross-sectional view of a CMOS image sensor having a pair of doped regions underneath a transfer gate electrode according to some embodiments.

FIG. 7 illustrates a cross-sectional view 700 of a CMOS image sensor having a first doped region 126 and a second doped region 128 underneath a transfer gate electrode according to some embodiments. As shown in FIG. 7, a high dose N-type region 128 may be substantially disposed under bottom of the vertical transfer gate electrode 116 to improve lag and anti-blooming. The n-type peak doping concentration is substantially in a range of from about 5e16 to about 1e18/cm³. A distance between the high dose N-type region 128 and the vertical transfer gate electrode 116 is in the range of 0 nm to 100 nm. Thus, the charge transfer capability of the vertical transfer gate electrode 116 is enhanced to improve full well capacity.

Figure 8:
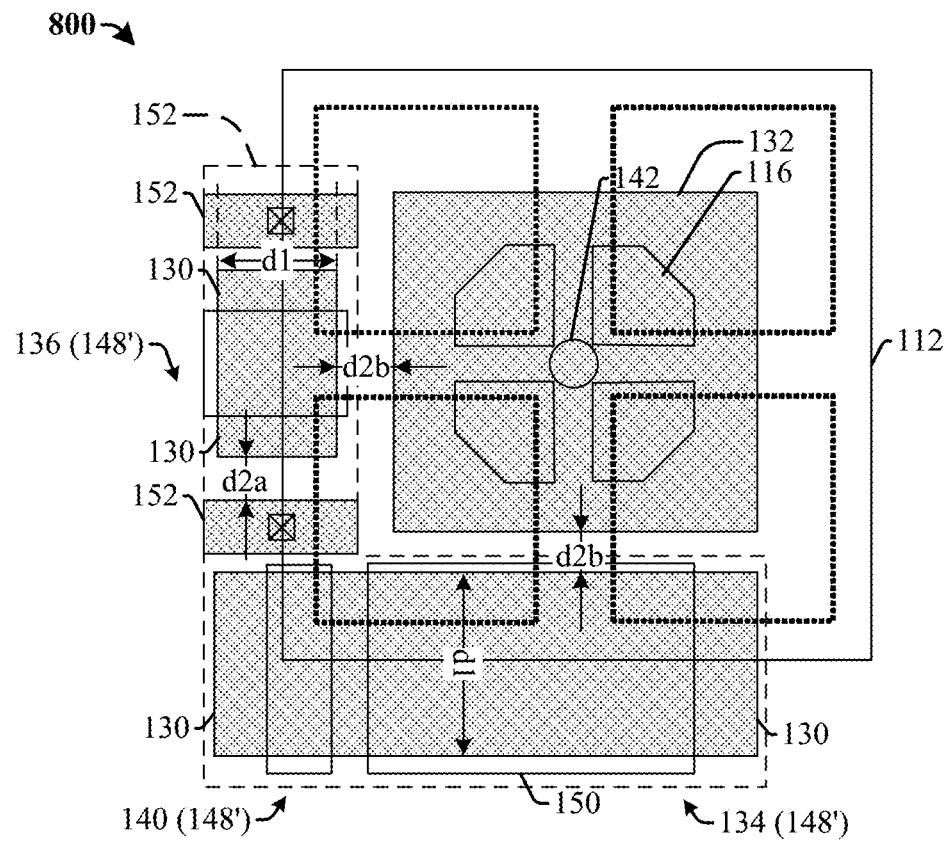
FIG. 8 illustrates a layout view of a 2×2 pixel area of a CMOS image sensor with a PMOS pixel device and an n-type pixel device well may be adopted to reduce pixel noise according to some embodiments.

FIG. 8 illustrates a layout view 800 of a 2×2 pixel area of a CMOS image sensor according to some embodiments. As shown in FIG. 8, PMOS pixel devices 148' (e.g. source follower transistor 134, row-select transistor 140, and reset transistor 136) with an n-type well may be adopted to reduce pixel noise. A width of the S/D regions 130 of the pixel device 148' may laterally overlap with the connecting pixel device well 152 to maintain a small resistance from the S/D regions 130 to the pixel device well 152. An overlap width d1 of the pixel device 148' and connecting pixel device well is greater than 50 nm. The pixel device well 152 and the S/D regions 130 are electrically separated by an insulator film, such as the STI structure 112. A width d2 of the isolation insulator film between the pixel device well 152 and the S/D regions 130 is smaller than that of other isolation areas such as d2a between the row-select transistor 140 and the reset transistor 136 or d2b between the pixel devices 148 and the doped vertical isolation region 132.

Figure 9:
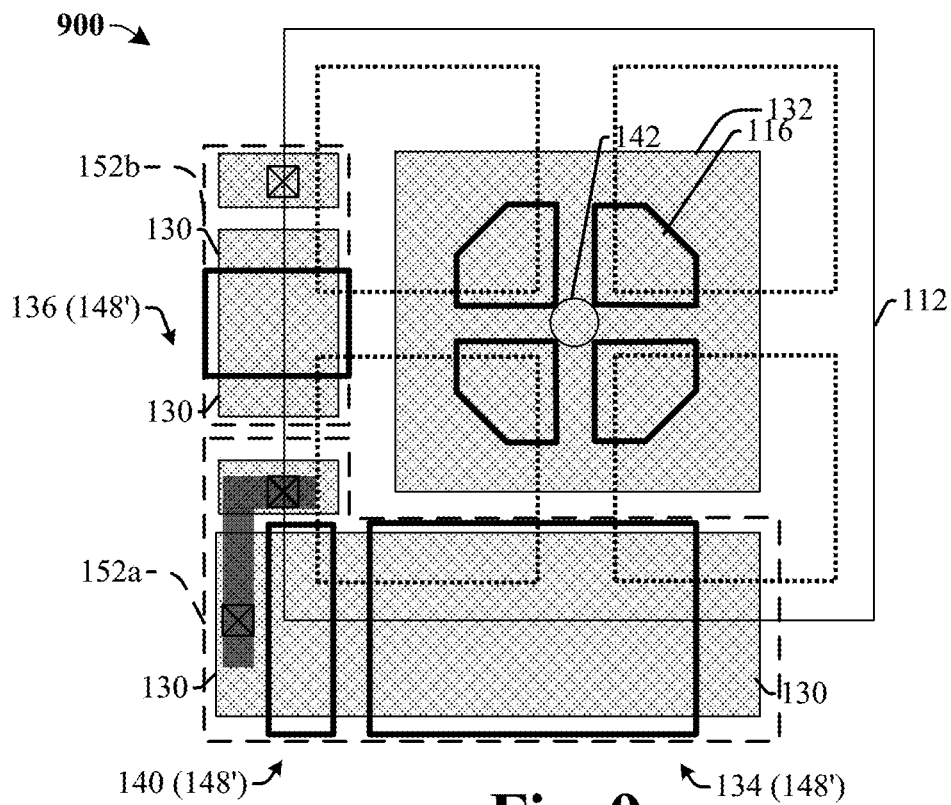
FIG. 9 illustrates a layout view of a 2×2 pixel area of a CMOS image sensor with dual pixel device wells according to some embodiments.

FIG. 9 illustrates a layout view 900 of a 2×2 pixel area of a CMOS image sensor with dual pixel device wells according to some embodiments. As shown in FIG. 9, a PMOS pixel device 148' (e.g. source follower transistor 134, row-select transistor 140, and reset transistor 136) with dual n-type pixel device well 152a and 152b is adopted to improve conversion gain. A first n-well 152a for the source follower transistor 134 is different from a second n-type pixel device well 152b for the reset transistor 136. The first n-well 152a may be connected to S/D regions 130 of the source follower transistor 134 or the select transistor device 140.

Figure 10:
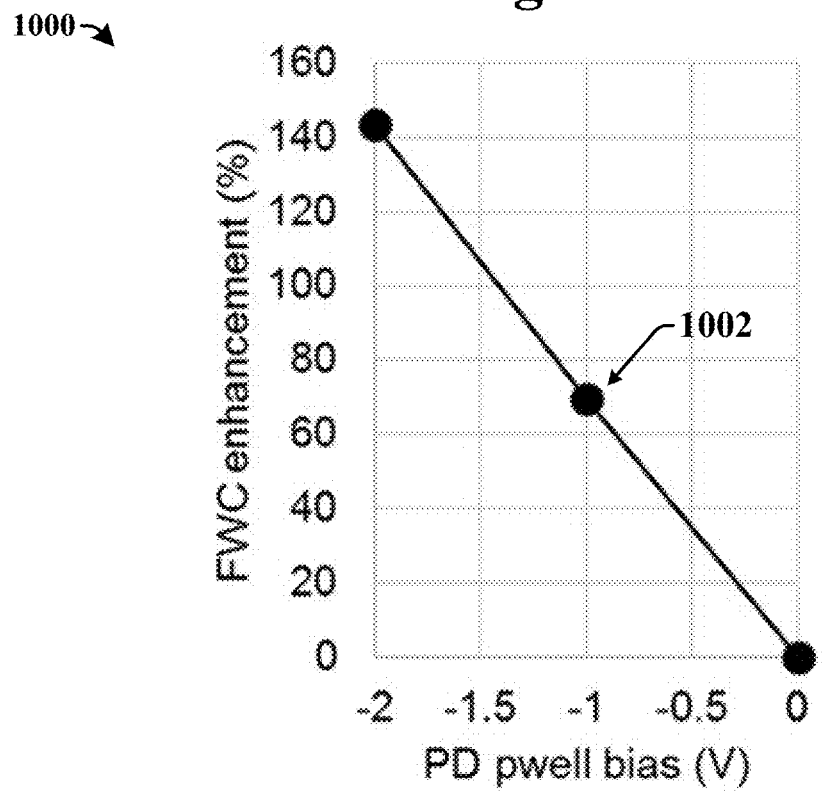
FIG. 10 illustrates a plot diagram showing an effect of biased photodiode doped well to full well capacity of a CMOS image sensor according to some embodiments.

FIG. 10 illustrates a plot diagram 1000 showing an effect of a biased photodiode doped well to full well capacity of a CMOS image sensor according to some embodiments. In some embodiments, the photodiode p-well (e.g. photodiode well region 154 in FIG. 1 or FIG. 4) and the pixel device well (e.g. pixel device well 152 in FIG. 1 or FIG. 4) are separated. The photodiode p-well (e.g. photodiode well region 154 in FIG. 1 or FIG. 4) may be negatively biased, and transfer gate bias during charge integration is equal to or lower than that of p-well bias so that dark current from transfer gate is suppressed. Negative p-well bias is beneficial to full well capacity enhancement. As shown by a dot 1002 in FIG. 10, a bias of the photodiode well region of −1.0 V may be equivalent to a 70% full well capacity increase.

Figure 11:
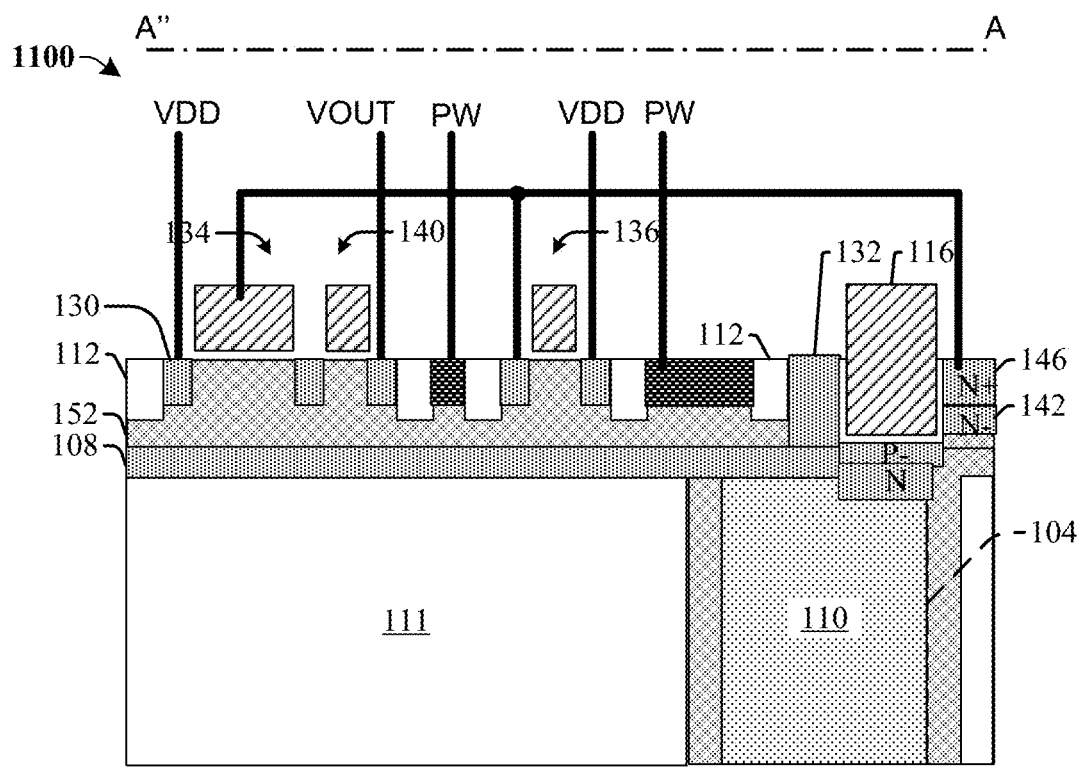
FIG. 11 illustrates a cross-sectional view of a CMOS image sensor having a doped isolation structure separating a photodiode and a pixel device according to some embodiments.

FIG. 11 illustrates a cross-sectional view 1100 of a CMOS image sensor having a doped isolation structure separating a photodiode and a pixel device according to some embodiments. FIG. 11 may be a cross-sectional view taken along line A-A" of FIG. 2. The descriptions associated with FIG. 1 and FIG. 2 may be fully incorporated herein. The pixel devices such as the reset transistor 136, the row-select transistor 140, and the source follower transistor 134 may be NMOS devices embedded in the p-type pixel device well 152. The reset transistor 136 may be separated from the row-select transistor 140 and the source follower transistor 134 by the STI structure 112. S/D regions 130 of the row-select transistor 140 and the source follower transistor 134 may be coupled to corresponding biasing nodes or output node.

Figure 12:
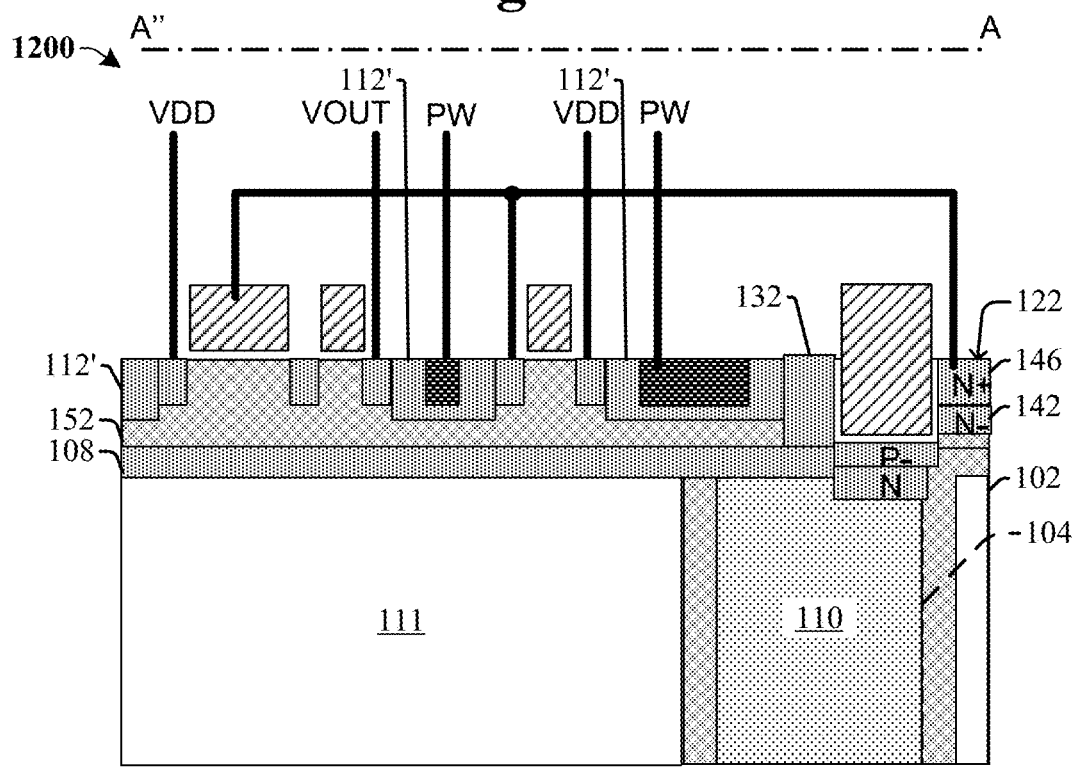
FIG. 12 illustrates a cross-sectional view of a CMOS image sensor having a doped isolation structure separating a photodiode and a pixel device according to some embodiments.

FIG. 12 illustrates a cross-sectional view of a CMOS image sensor having a doped isolation structure separating a photodiode and a pixel device according to some embodiments. Again, FIG. 12 may be a cross-sectional view taken along line A-A" of FIG. 2. Different from shown in the embodiments above, the pixel devices may be separated by a doped isolation structure 112' in some alternative embodiments, in replacement of the dielectric STI structure 112 described before. The doped isolation structure 112' may comprise doped silicon or other semiconductor material, and may have a depth deeper than the S/D regions 130 or other contact regions. Similar as the dielectric STI structure 112 described above, the doped isolation structure 112' may be disposed within an upper portion of the p-type pixel device well 152 from the front-side 122 of the substrate 102. The doped isolation structure 112' may be disposed covering bottom and sidewall surfaces of a contact region PW of the pixel device well 152. The doped isolation structure 112' may abut a sidewall of the doped vertical isolation region 132.

Figure 13:
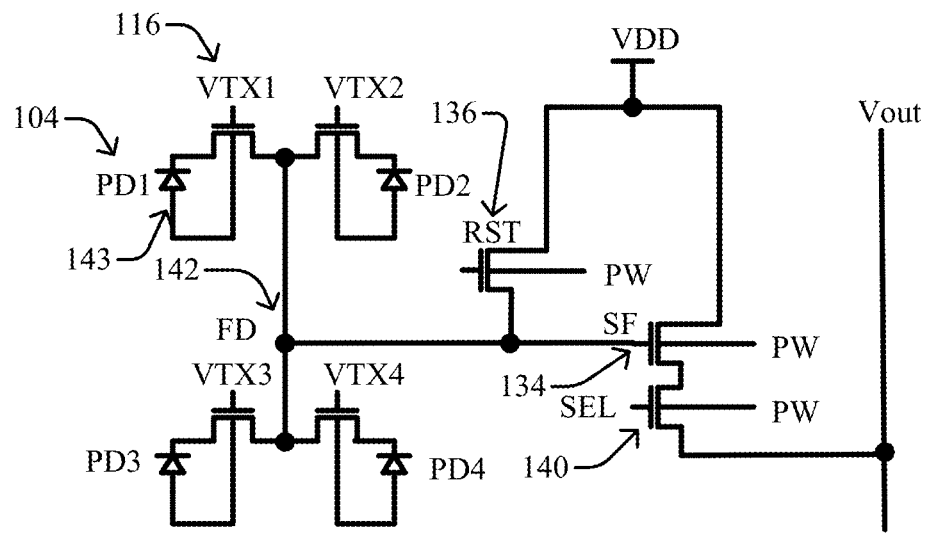
FIG. 13 illustrates a circuit diagram of some embodiments of a 2×2 pixel of an image sensor corresponding to FIG. 11 or FIG. 12 above in accordance with some embodiments.

FIG. 13 illustrates a circuit diagram of some embodiments of a 2×2 pixel of an image sensor corresponding to FIG. 11 or FIG. 12 above in accordance with some embodiments. The photodiodes PD1-PD4 of the pixel sensor may stand for the photodiode 104 of the sensing pixels 103a of FIG. 4 or other embodiments of the image sensors described above. As shown in FIG. 4, when incident light (containing photons of sufficient energy) strikes the photodiode 104, an electron-hole pair is created. If absorption occurs in the junction's depletion region, or one diffusion length away from it, the carriers of this electron-hole pair are swept from the junction by the built-in electric field of the depletion region. Thus holes move toward an anode region of the photodiode 104 (also PD1-PD4 in FIG. 13 and some following figures) and electrons toward a cathode region of the photodiode 104, and a photocurrent is produced. The total current through the photodiode 104 is the sum of the dark current (current that is generated in the absence of light) and the photocurrent. The photodiode 104 is electrically connected to a floating diffusion well 142 (also FD in FIG. 13 and some following figures) by way of a transfer gate electrode 116 (also VTX1-VTX4 in FIG. 13 and some following figures). The other end of the photodiode 104 may be connected to a photodiode surrounding well node 143. The transfer gate electrode 116 selectively transfers charge from the photodiode 104 to the floating diffusion well 142. A reset transistor 136 (also RST in FIG. 13 and some following figures) is electrically connected between a DC voltage supply terminal Vdd and the floating diffusion well 142 to selectively clear charge at the floating diffusion well 142. A source follower transistor 134 (also SF in FIG. 13 and some following figures) is electrically connected between Vdd and an output Vout, and is gated by the floating diffusion well 142, to allow the charge level at the floating diffusion well 142 to be observed without removing the charge. A row select transistor 140 (also SEL in FIG. 13 and some following figures) is electrically connected between the source follower transistor 134 and the output Vout to selectively output a voltage proportional to the charge at the floating diffusion well 142. A current source may be connected between the row select transistor 140 and the output Vout.

During use, the pixel sensor is exposed to an optical image for a predetermined integration period. Over this period of time, the pixel sensor records the intensity of light incident on the photodiode 104 by accumulating charge proportional to the light intensity. After the predetermined integration period, the amount of accumulated charge is read. In some embodiments the amount of accumulated charge for the photodiode 104 is read by momentarily activating the reset transistor 136 to clear the charge stored at the floating diffusion well 142. Thereafter, the row select transistor 140 is activated and the accumulated charge of the photodiode 104 is transferred to the floating diffusion well 142 by activating the transfer gate electrode 116 for a predetermined transfer period. During the predetermined transfer period, the voltage at the output Vout is monitored. As the charge is transferred, the voltage at the output Vout varies, typically decreasing. After the predetermined transfer period, the change in the voltage observed at the output Vout is proportional to the intensity of light recorded at the photodiode 104.

Figure 14:
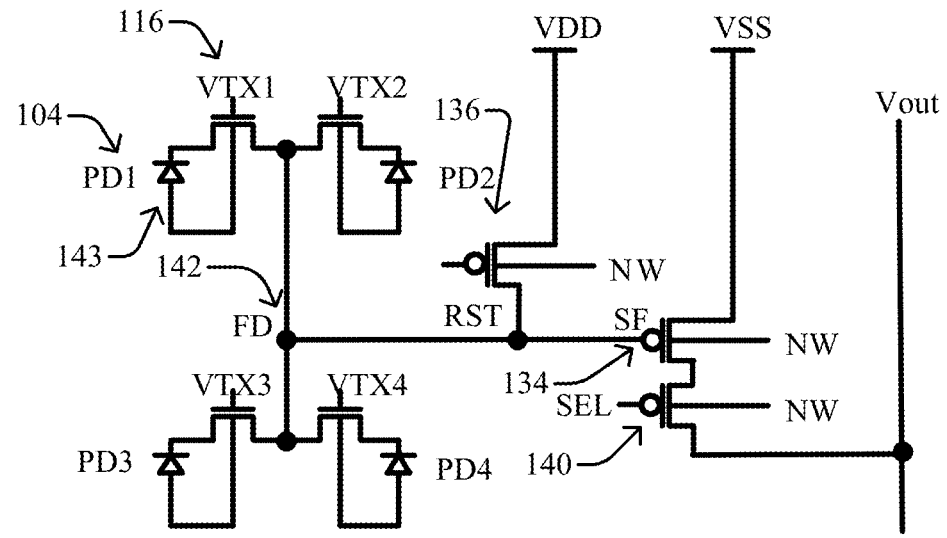
FIG. 14 illustrates a circuit diagram of some embodiments of a 2×2 pixel of an image sensor corresponding to FIG. 15 or FIG. 16 below in accordance with some embodiments.

FIG. 14 illustrates a circuit diagram of some embodiments of a 2×2 pixel of an image sensor corresponding to FIG. 15 or FIG. 16 below in accordance with some embodiments. The photodiodes PD1-PD4 of the pixel sensor may stand for the photodiode 104 of the sensing pixels 103a of FIG. 4 or other embodiments of the image sensors described above. Compared to the circuit diagram shown in FIG. 13, the pixel devices such as the reset transistor 136, the row-select transistor 140, and the source follower transistor 134 may be PMOS devices with p-type S/D regions embedded in the n-type pixel device well NW.

Figure 15:
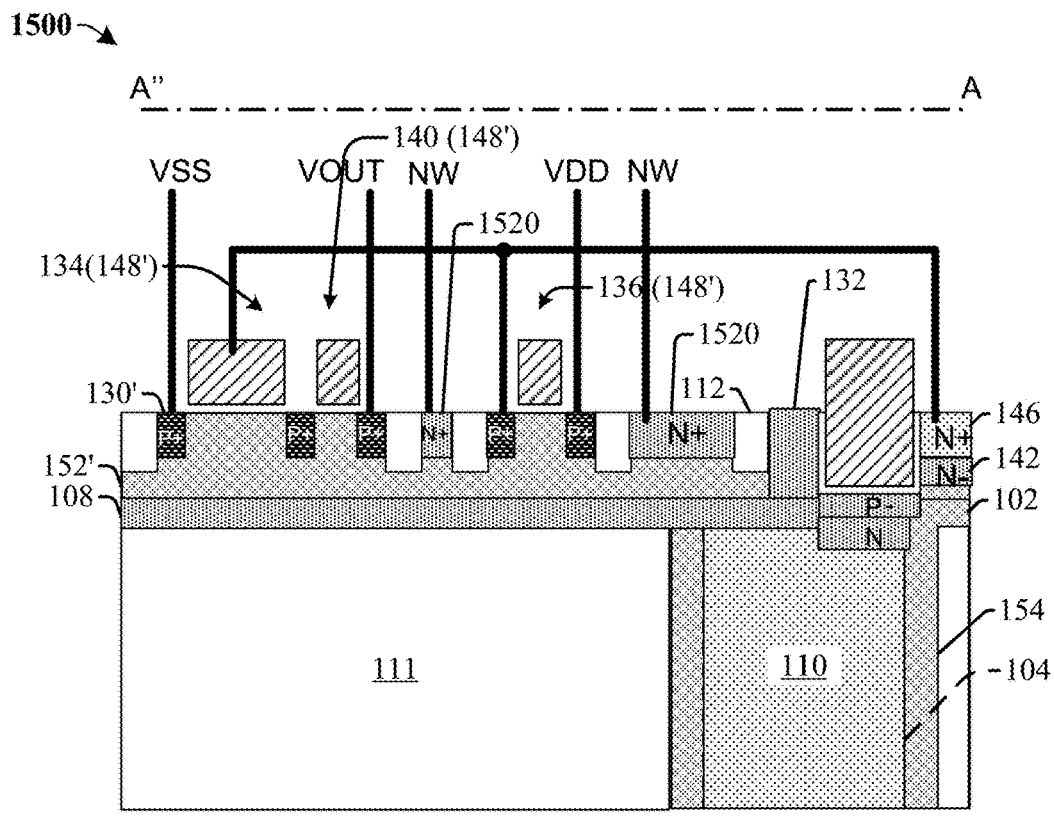
FIG. 15 illustrates a cross-sectional view of a CMOS image sensor having a doped isolation structure separating a photodiode and a PMOS pixel device according to some embodiments.

FIG. 15 illustrates a cross-sectional view 1500 of a CMOS image sensor having a dielectric isolation structure 112 separating a photodiode 104 and a PMOS pixel device 148' according to some embodiments. Compared to the CMOS image sensor shown in FIG. 11, the pixel devices such as the reset transistor 136, the row-select transistor 140, and the source follower transistor 134 may be PMOS devices with p-type S/D regions 130' embedded in the n-type pixel device well 152'. The contact region 1520 of the pixel device well 152' may be heavily doped with an n-type dopant. The reset transistor 136 may be separated from the row-select transistor 140 and the source follower transistor 134 by the STI structure 112. The S/D regions 130' of the row-select transistor 140 and the source follower transistor 134 may be coupled to corresponding biasing nodes or output node.

Figure 16:
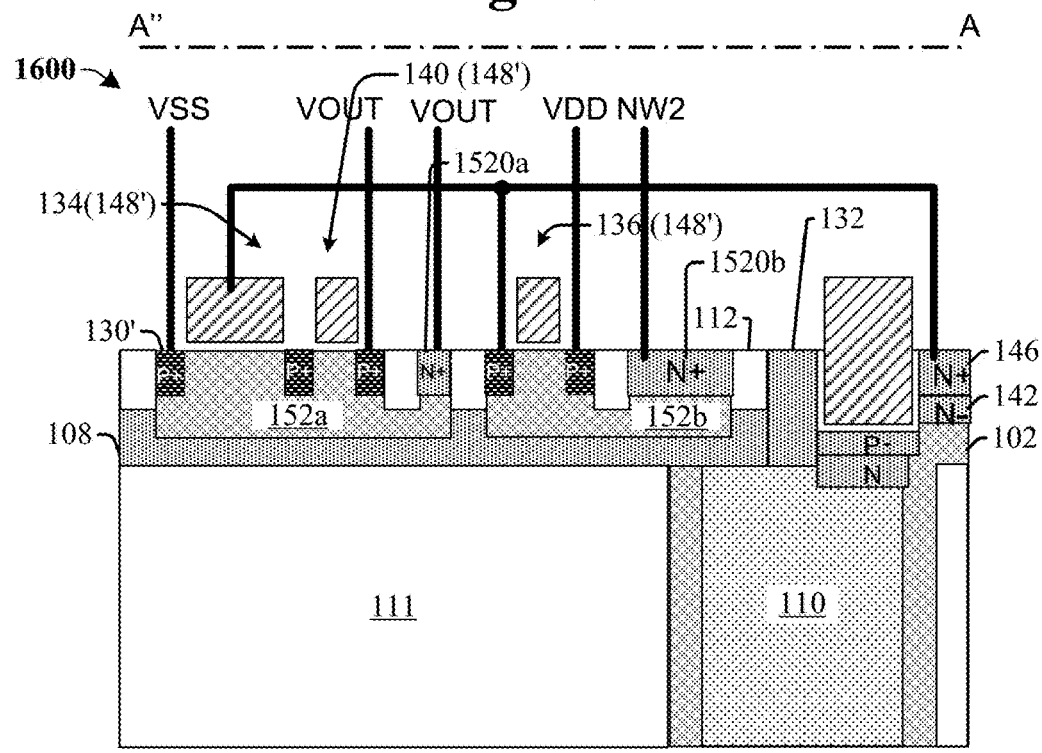
FIG. 16 illustrates a cross-sectional view of a CMOS image sensor having a doped isolation structure separating a photodiode and a pixel device according to some embodiments.

FIG. 16 illustrates a cross-sectional view 1600 of a CMOS image sensor having a dual n-type well structure for PMOS pixel devices 148' according to some embodiments. The PMOS pixel devices 148' may comprise the reset transistor 136, the row-select transistor 140, and the source follower transistor 134 with p-type S/D regions 130' embedded in multiple n-type pixel device wells 152a, 152b. As an example, the row-select transistor 140, the source follower transistor 134, and a first contact region 1520a may be disposed within a first n-type pixel device well 152a. The reset transistor 136 and a second contact region 1520b may be disposed within a second n-type pixel device well 152b. The S/D regions 130' of the PMOS pixel devices 148' and the n-type pixel device wells 152a, 152b may be coupled to corresponding biasing nodes or output node as shown in the figure.

Figure 17:
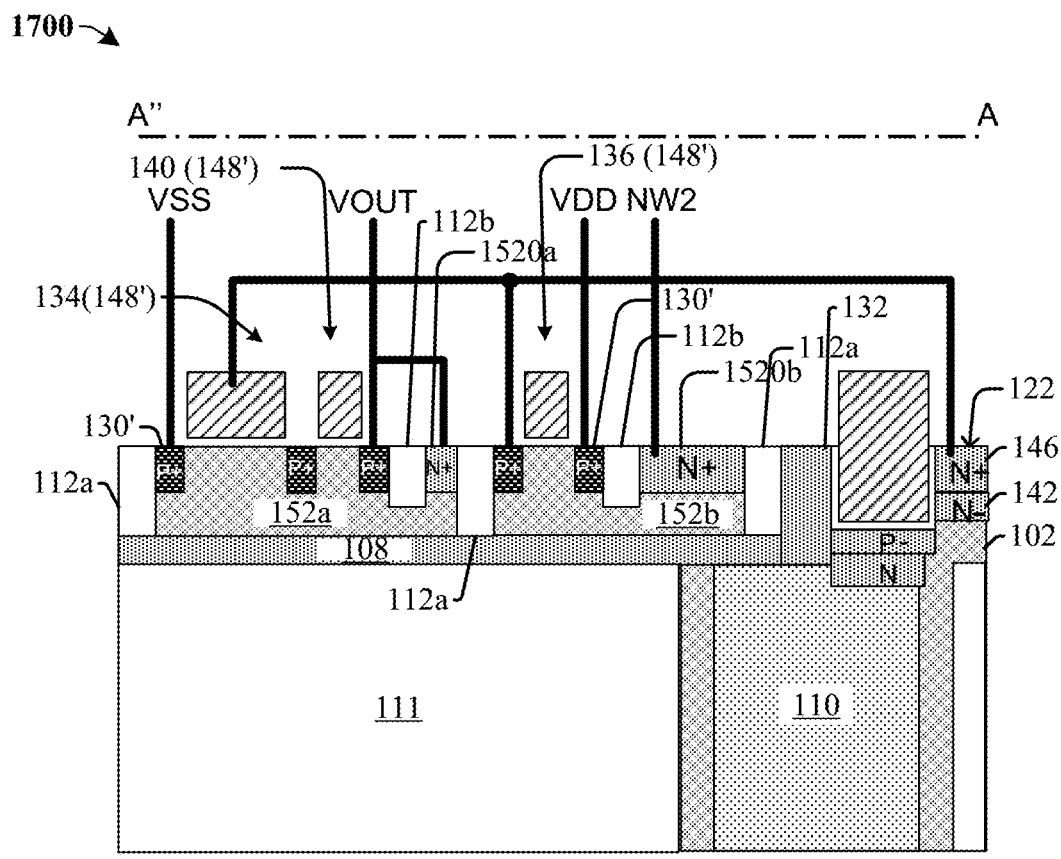
FIG. 17 illustrates a cross-sectional view of a CMOS image sensor having a dual STI structure for PMOS pixel devices according to some embodiments.

FIG. 17 illustrates a cross-sectional view 1700 of a CMOS image sensor having a dual STI structure for PMOS pixel devices 148' according to some embodiments. A first STI structure 112a is disposed at a peripheral region of the PMOS pixel devices 148'. The first STI structure 112a may also be disposed between and isolate various pixel devices. For example, the first STI structure 112a may isolate the reset transistor 136 and the row-select transistor 140. The first STI structure 112a has a first depth from the front-side 122 of the substrate 102. The first depth may be substantially equal to depths of the first n-type pixel device well 152a and the second n-type pixel device well 152b. The first STI structure 112a may reach on a to surface of the doped lateral isolation region 108. A second STI structure 112b is disposed to isolate the PMOS pixel devices 148' and a contact region of the n-type pixel device wells 152a, 152b. For example, the second STI structure 112b may be disposed between and isolate the S/D regions 130' of the row-select transistor 140 and the first contact region 1520a of the first n-type pixel device well 152a. The second STI structure 112b may also be disposed between and isolate the S/D regions 130' of the reset transistor 136 and the second contact region 1520b of the second n-type pixel device well 152b. The second STI structure 112b has a second depth from the front-side 122 of the substrate 102. The second depth is smaller than the first depth.

Figure 18:
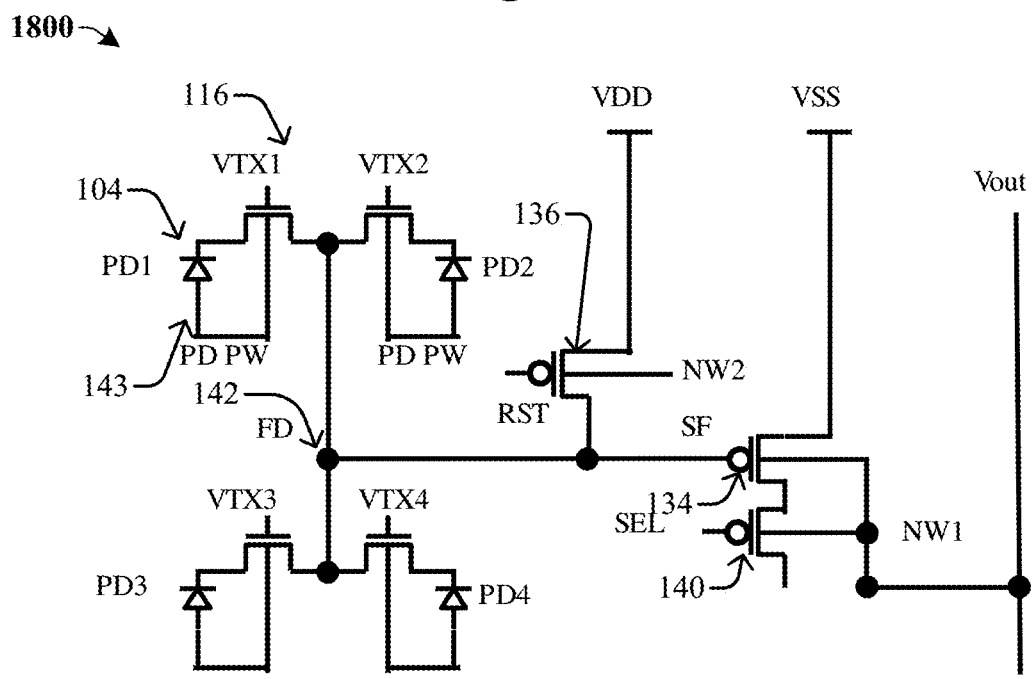
FIG. 18 illustrates a circuit diagram of some embodiments of a 2×2 pixel of an image sensor corresponding to FIG. 17 or FIG. 20 in accordance with some embodiments.

FIG. 18 illustrates a circuit diagram of some embodiments of a 2×2 pixel of an image sensor corresponding to FIG. 19 or FIG. 20 below in accordance with some embodiments. The photodiodes PD1-PD4 of the pixel sensor may stand for the photodiode 104 of the sensing pixels 103a of FIG. 4 or other embodiments of the image sensors described above. Compared to the circuit diagram shown in FIG. 14, the pixel devices such as the reset transistor 136, the row-select transistor 140, and the source follower transistor 134 may be PMOS devices with p-type S/D regions and respectively embedded in a first n-type pixel device well NW1 (152a in FIG. 19 or FIG. 20) and a second n-type pixel device well NW2 (152b in FIG. 19 or FIG. 20).

Figure 19:
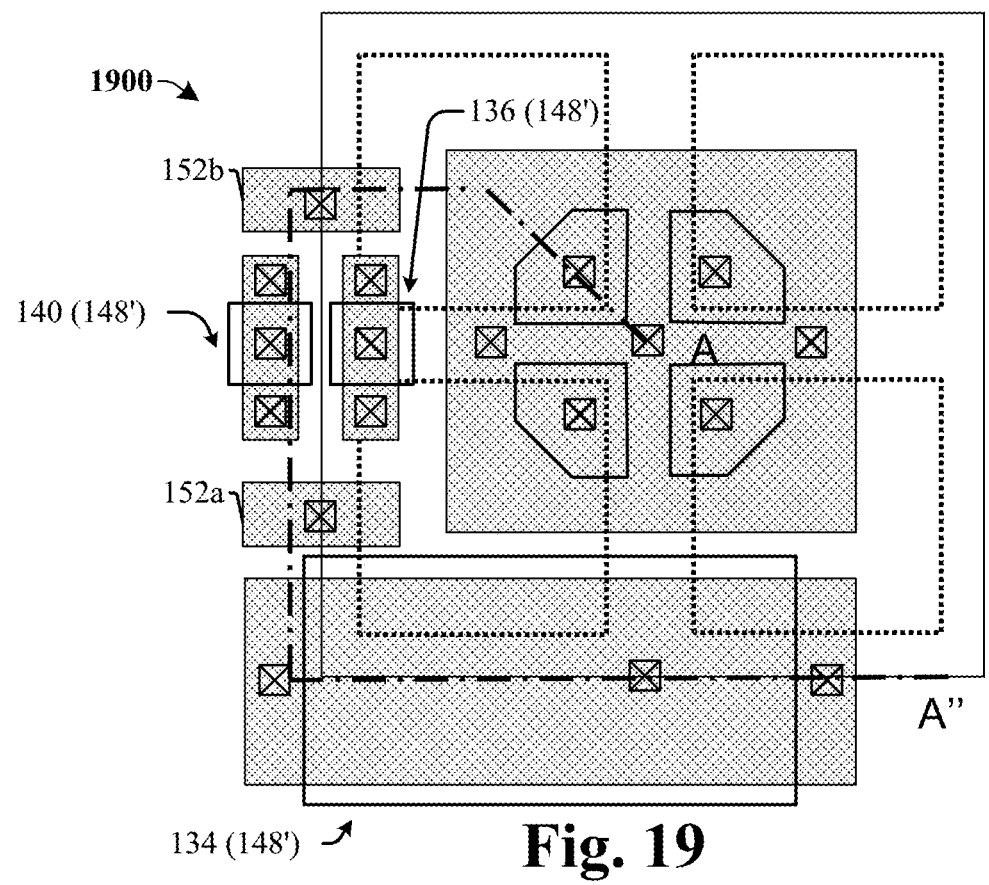
FIG. 19 and FIG. 20 illustrate a layout view and a cross-sectional view of a CMOS image sensor having the source follower transistor disposed within the first n-type pixel device well and the select transistor 1 separately disposed within the second n-type pixel device well according to some additional embodiments.
Figure 20:
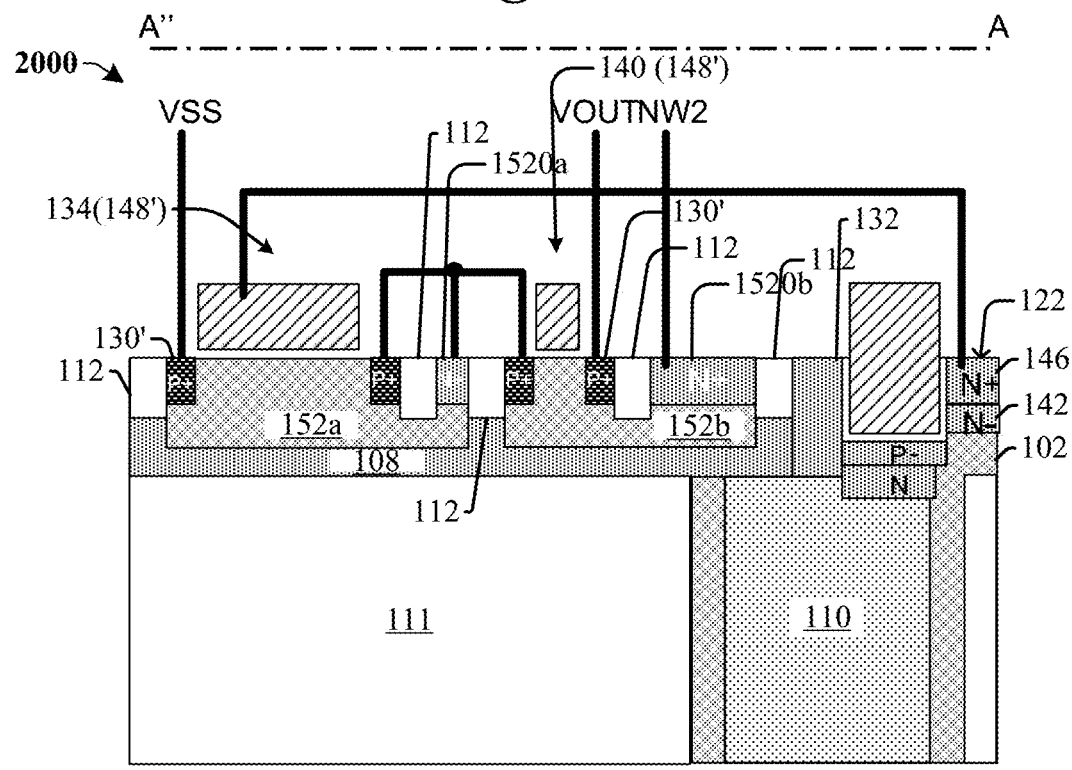

FIG. 19 and FIG. 20 illustrate a layout view 1900 and a cross-sectional view 2000 of a CMOS image sensor having the source follower transistor 134 disposed within the first n-type pixel device well 152a and the select transistor 140 separately disposed within the second n-type pixel device well 152b according to some additional embodiments. The first n-type pixel device well 152a and the second n-type pixel device well 152b may be isolated by the STI structure 112. The reset transistor 136 and the select transistor 140 may be arranged on the same side of the 2×2 pixel of an image sensor, thus the source follower transistor 134 can be solely arranged on another side of the 2×2 pixel of the image sensor and have a greater dimension.

Figure 21:
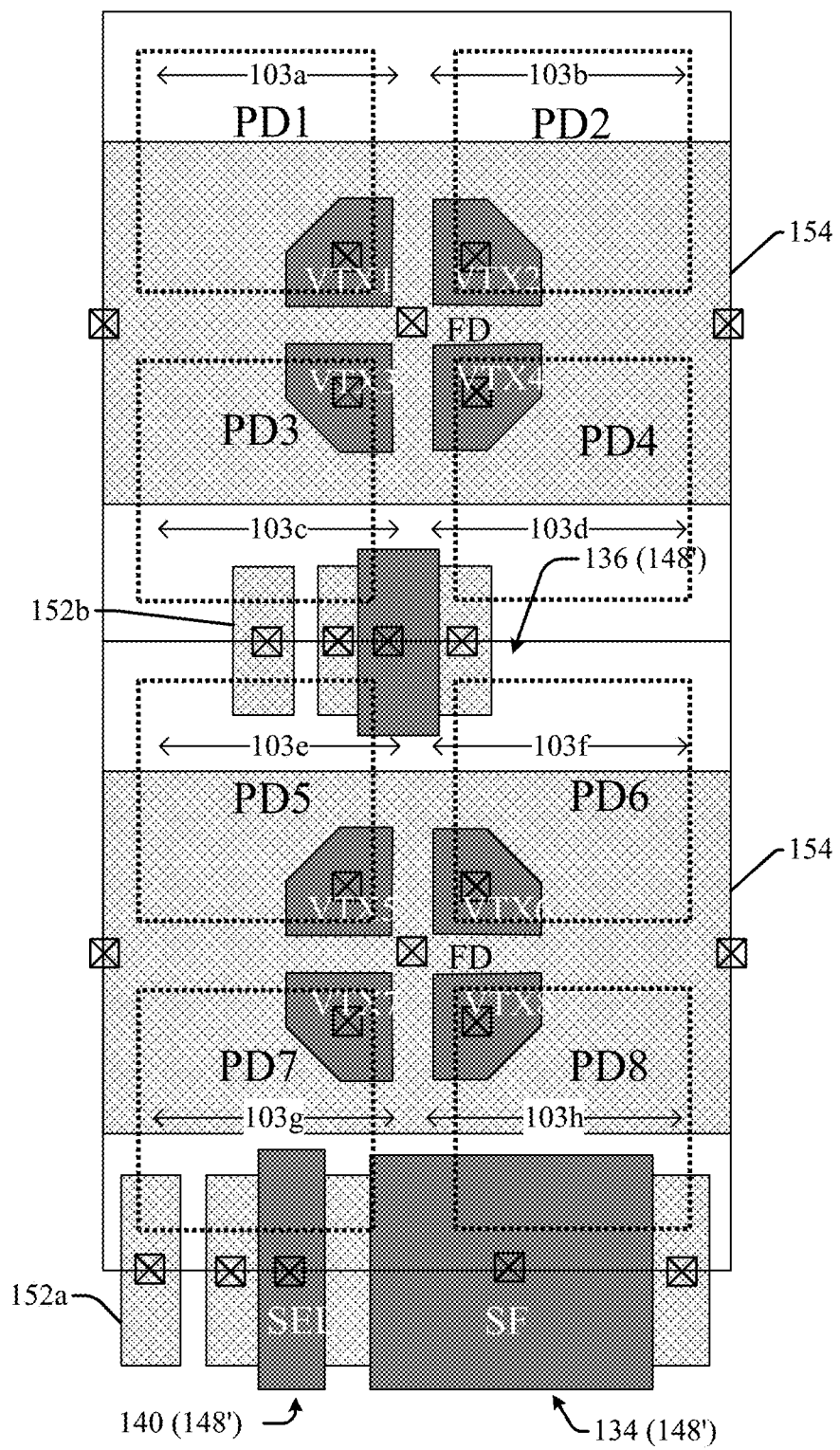
FIG. 21 illustrates a layout view of a 2×4 pixel area of a CMOS image sensor with PMOS pixel devices disposed within dual n-type pixel device wells according to some additional embodiments.
Figure 22:
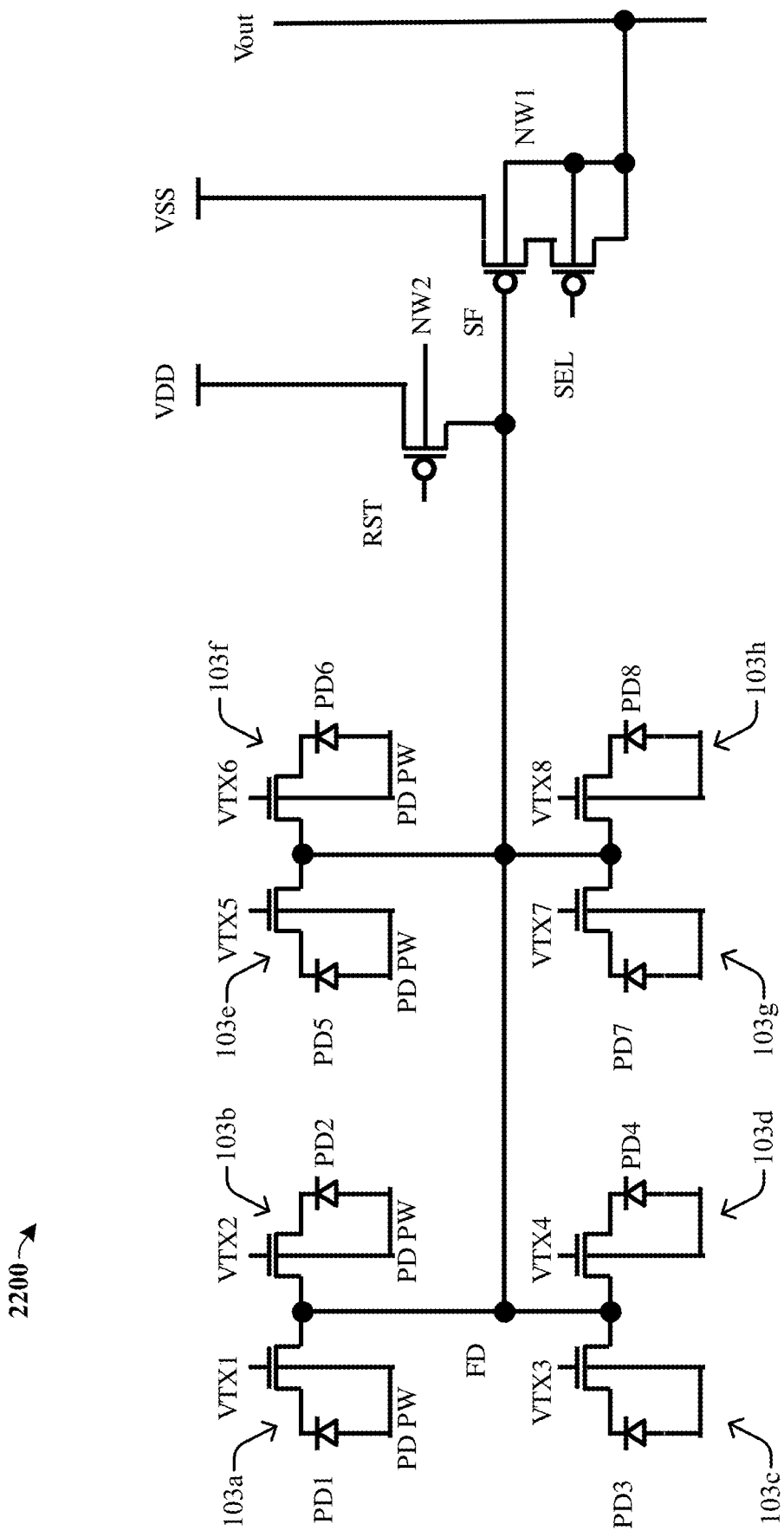
FIG. 22 illustrates a circuit diagram of some embodiments of a 2×4 pixel of an image sensor corresponding to FIG. 21 in accordance with some embodiments.

FIG. 21 illustrates a layout view of a 2×4 pixel area of a CMOS image sensor with PMOS pixel devices 148' disposed within dual n-type pixel device wells 152a, 152b according to some additional embodiments. FIG. 22 illustrates a circuit diagram of some embodiments of a 2×4 pixel of an image sensor corresponding to FIG. 21. As an example, eight unit pixels 103a-h share the select transistor 140 and the source follower transistor 134 disposed within the first n-type pixel device well 152a and the reset transistor 136 disposed within the second n-type pixel device well 152b.

Figure 23:
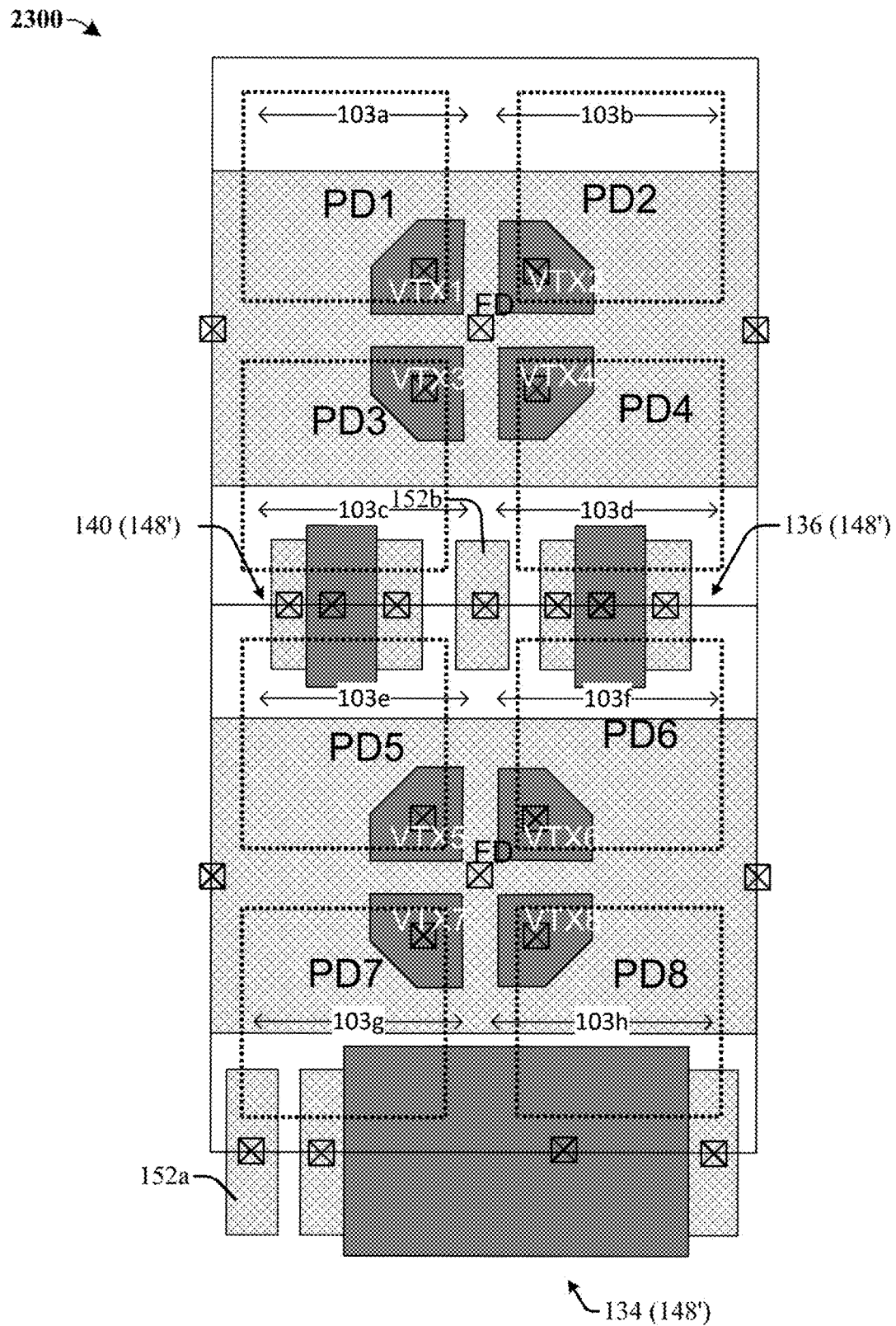
FIG. 23 illustrates a layout view of a 2×4 pixel area of a CMOS image sensor with PMOS pixel devices disposed within dual n-type pixel device wells according to some additional embodiments.
Figure 24:
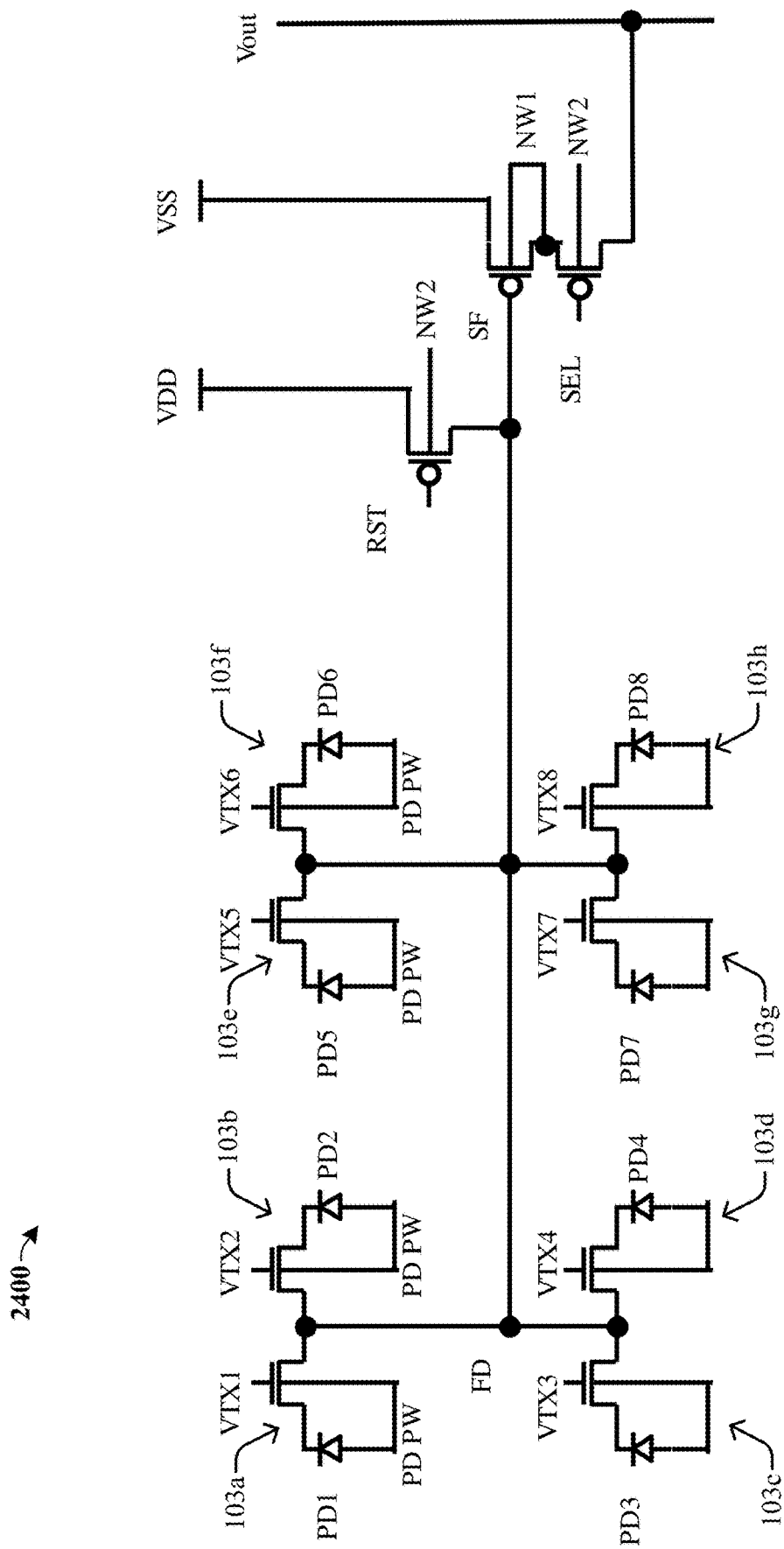
FIG. 24 illustrates a circuit diagram of some embodiments of a 2×4 pixel of an image sensor corresponding to FIG. 23 in accordance with some embodiments.

FIG. 23 illustrates a layout view of a 2×4 pixel area of a CMOS image sensor with PMOS pixel devices 148' disposed within dual n-type pixel device wells 152a, 152b according to some additional embodiments. FIG. 24 illustrates a circuit diagram of some embodiments of a 2×4 pixel of an image sensor corresponding to FIG. 23. The select transistor 140 and the reset transistor 136 are disposed within the first n-type pixel device well 152a. The first n-type pixel device well 152a may be disposed between a first set of 2×2 unit pixels 103a-d and a second set of 2×2 unit pixels 103e-h. The source follower transistor 134 is disposed within the second n-type pixel device well 152b. The second n-type pixel device well 152b may be disposed at one side of the second set of 2×2 unit pixels 103e-h opposite to the first set of 2×2 unit pixels 103a-d.

FIGS. 25-34 illustrate some embodiments of layout views and/or cross-sectional views showing a method of forming a CMOS image sensor having a doped isolation structure separating a photodiode and a pixel device.

Figure 25:
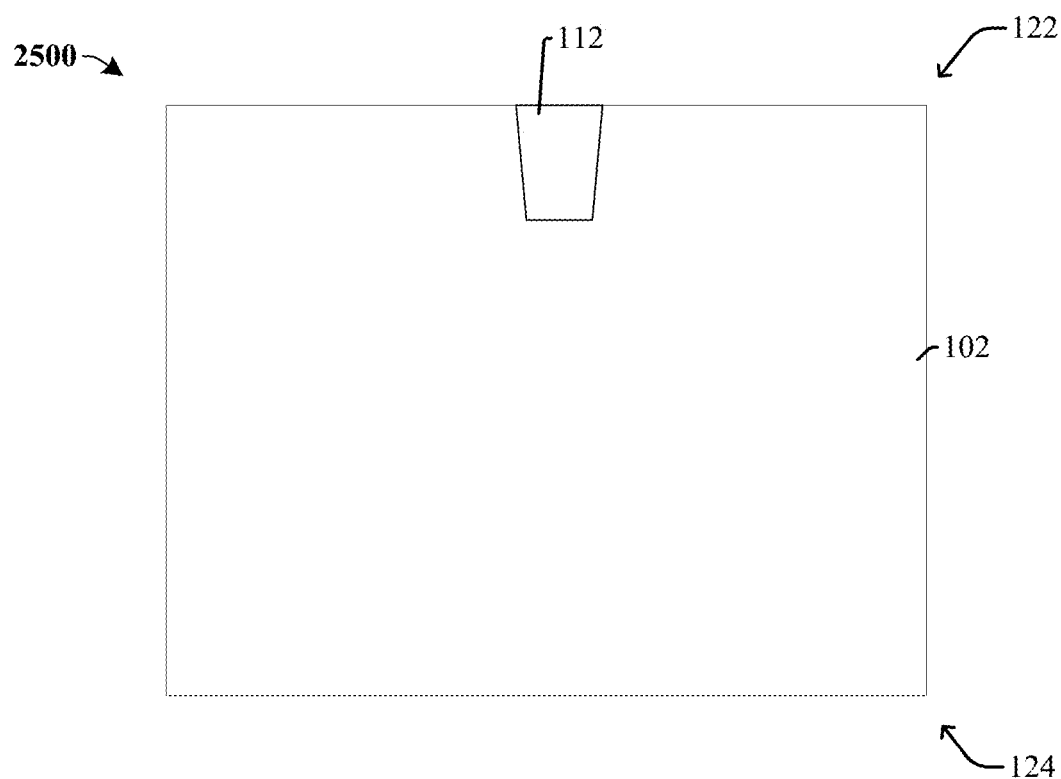
FIGS. 25-34 illustrate some embodiments of cross-sectional views showing a method of forming a CMOS image sensor having a pixel device on a photodiode structure.

As shown in cross-sectional view 2500 of FIG. 25, the substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 may be prepared including forming an epitaxial layer having a first doping type (e.g. p-type) doping concentration in a range of from about $10^{13}/cm^3$ to about $10^{15}/cm^3$. Then, the shallow trench isolation (STI) structure 112 is formed from a front-side 122 of the substrate 102. The STI structure 112 may be formed by performing an etching process to form a shallow trench ring at a peripheral region of a sensing pixel of the CMOS image sensor. Then a dielectric layer is filled into the shallow trench ring and over the substrate 102, followed by an etching back process to etch and expose a top surface of the substrate 102.

Figure 26:
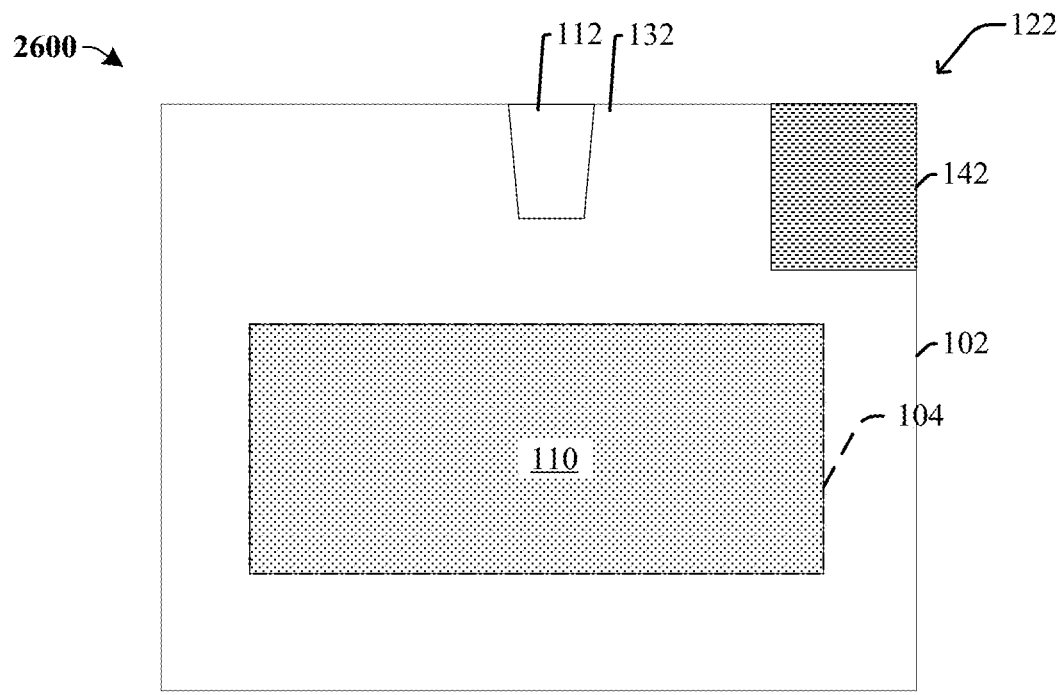

As shown in cross-sectional view 2600 of FIG. 26, a first dopant is implanted into the substrate 102 to form doped region with a second doping type (e.g. n-type) including a photodiode doped region 110 within the substrate 102 and a floating diffusion well 142 at the front-side 122 of the substrate 102. The first dopant may comprise the second doping type (e.g. an n-type dopant such as phosphorus) that is implanted from the front-side 122 of the substrate 102. Doping concentration of the floating diffusion well 142 is maximum at silicon surface and gradually decreases as depth increases. Though not shown in the figure, in some alternative embodiments, a doping well with the first doping type (e.g. p-type) with a doping concentration in a range of from about $10^{14}/cm^3$ to about $10^{18}/cm^3$ may be formed within the epitaxial layer as a first region of the photodiode to be formed. The photodiode doped region contacts the substrate 102 or the doping well to form the photodiode 104. The photodiode doped region 110 may be formed away from the front-side 122 of the substrate 102. The photodiode doped region 110 may be formed to have a top surface at a depth deeper than a bottom surface of the STI structure 112.

Figure 27:
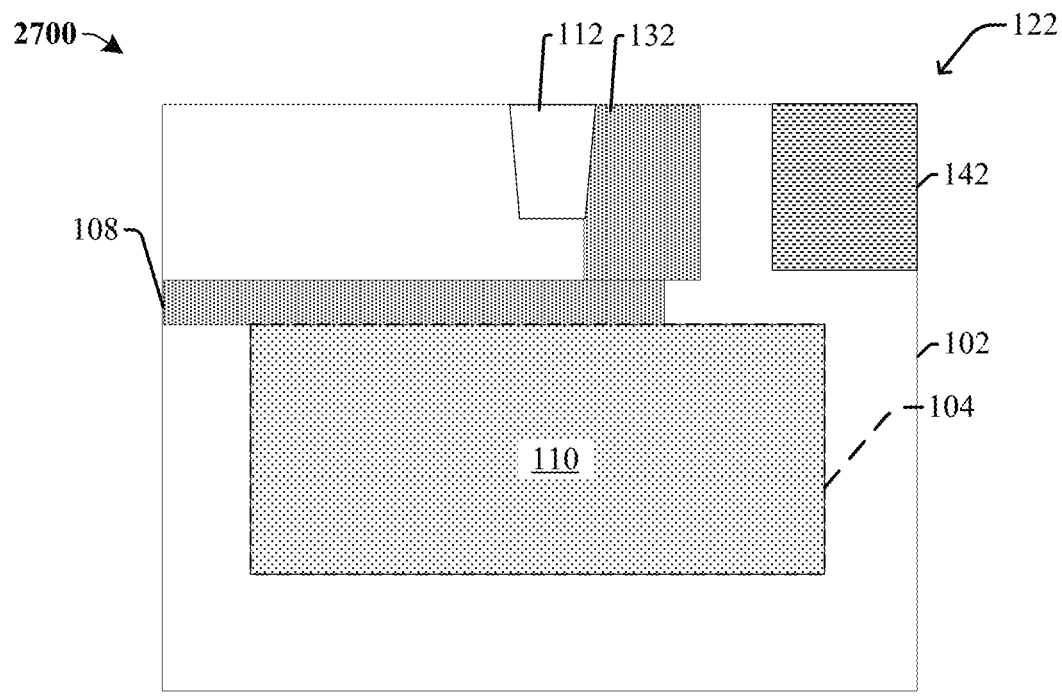

As shown in cross-sectional view 2700 of FIG. 27, varies doping regions with the first doping type (e.g. p-type) are formed. The concentration of these doping regions may be in a range from about 1e15 to about 1e18/cm³. The doped lateral isolation region 108 is formed between the photodiode and pixel device region, and the doping concentration is substantially in the range of from about 1e17 to about 1e19/cm³. The doped vertical isolation region 132 is formed from the front-side 122 of the substrate 102. The doped lateral isolation region 108 may be formed non-depleted, then may be biased by pixel p-well electrode. As a result, p-n junction capacitance is increased. The doped vertical isolation region 132 may be formed surrounding vertical transfer gate sidewall to be formed except for floating diffusion side, and thus to suppress depletion region extending to pixel device region during read out. The Pixel device well doping concentration and photodiode doping concentration are substantially in the range of 1e16 to 1e18/cm3, and lower than the doped lateral isolation region 108 and the doped vertical isolation region 132.

Figure 28:
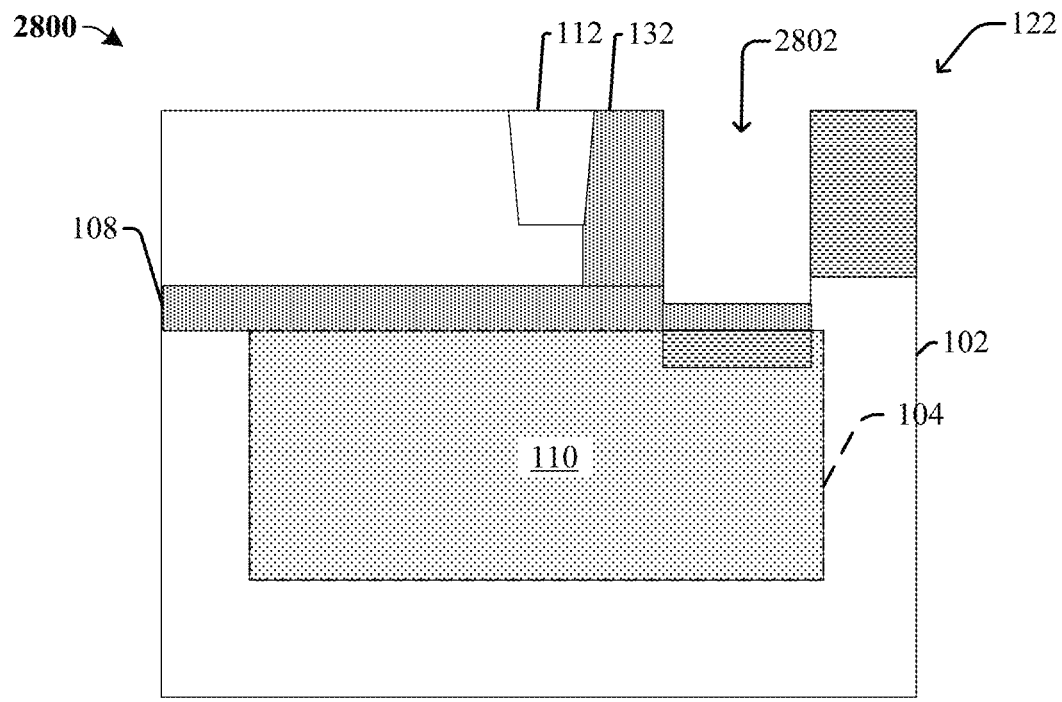

As shown in cross-sectional view 2800 of FIG. 28, a vertical gate trench 2802 is formed extending from the front-side of the substrate 102. A p-type region is made substantially under the vertical gate trench 2802 to protect VTX interface and control overflow potential. A N-type region is formed under the p-type region to improve lag and make potential gradient from photodiode to floating diffusion during read out.

Figure 29:
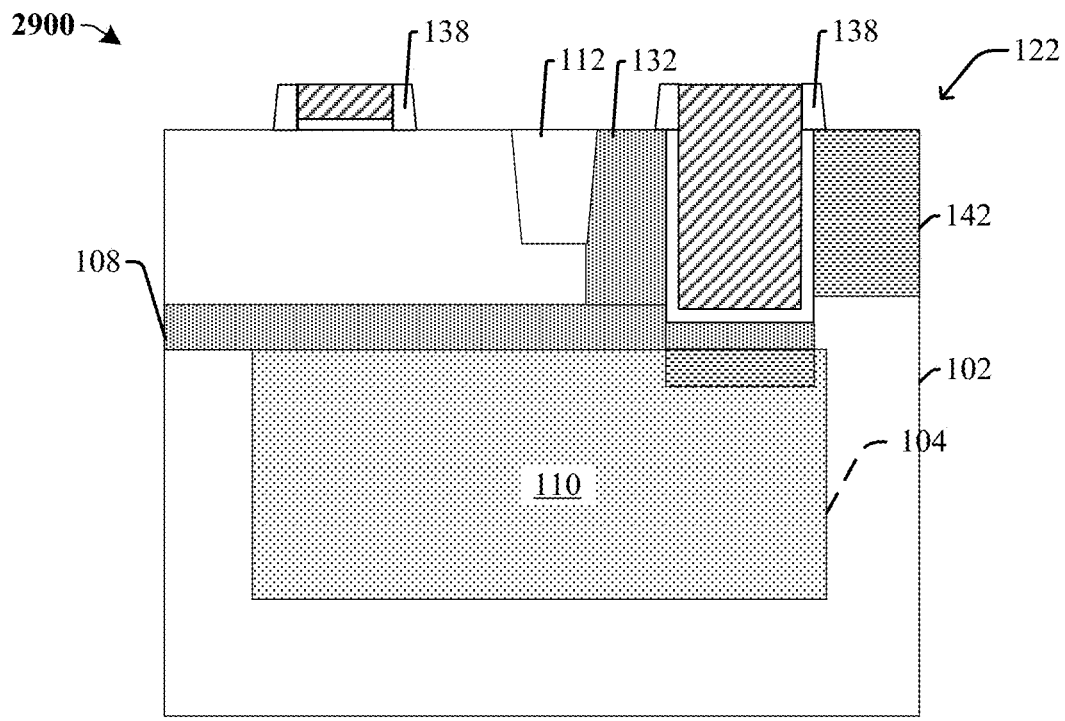

As shown in cross-sectional view 2900 of FIG. 29, the vertical transfer gate layer is patterned to form the transfer gate electrode 116 and gate structures for pixel devices 148 such as a source follower transistor 134, a reset transistor 136, and/or a row select transistor 140 are formed over the front-side 122 of the substrate 102. The gate structures may be formed by depositing a gate dielectric film and a gate electrode film over the substrate 102. The gate dielectric film and the gate electrode film are subsequently patterned to form a gate dielectric layer and a gate electrode. Sidewall spacers 138 may be formed on the outer sidewalls of the gate electrode. In some embodiments, the sidewall spacers 138 may be formed by depositing nitride onto the front-side 122 of the substrate 102 and selectively etching the nitride to form the sidewall spacers 138.

Figure 30:
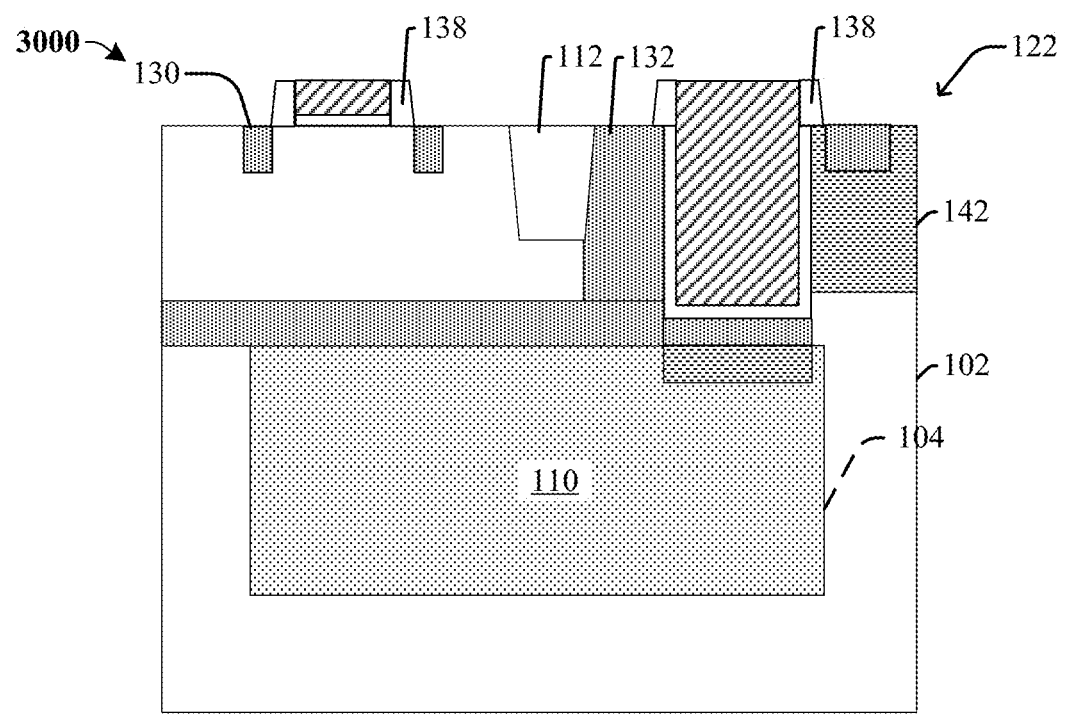

As shown in cross-sectional view 3000 of FIG. 30, a plurality of implantation process is performed. Implantation processes are performed within the front-side 122 of the substrate 102 to form a floating diffusion well 142 along one side of the transfer gate electrode 116. S/D regions 130 are formed alongside the gate structures for pixel devices 148 such as the source follower transistor 134, the reset transistor 136, and/or the row select transistor 140. In some embodiments, a second dopant may be implanted using a patterned mask to form a doped lateral isolation region 108 extending into a first depth of the substrate 102 from the front-side 122. The second dopant specie may comprise the first doping type (e.g. a p-type dopant such as boron). The doped lateral isolation region 108 may have a greater doping concentration than the doping well. An example doping concentration of the doped lateral isolation region 108 can be in a range of from about $10^{16}$/cm$^3$ to about $10^{18}$/cm$^3$. An example doping concentration of the floating diffusion well 142 and the S/D regions 130 can be in a range of from about $10^{18}$/cm$^3$ to about $10^{21}$/cm$^3$. In some embodiments, the substrate 102 may be selectively implanted according to a patterned masking layer (not shown) comprising photoresist.

Figure 31:
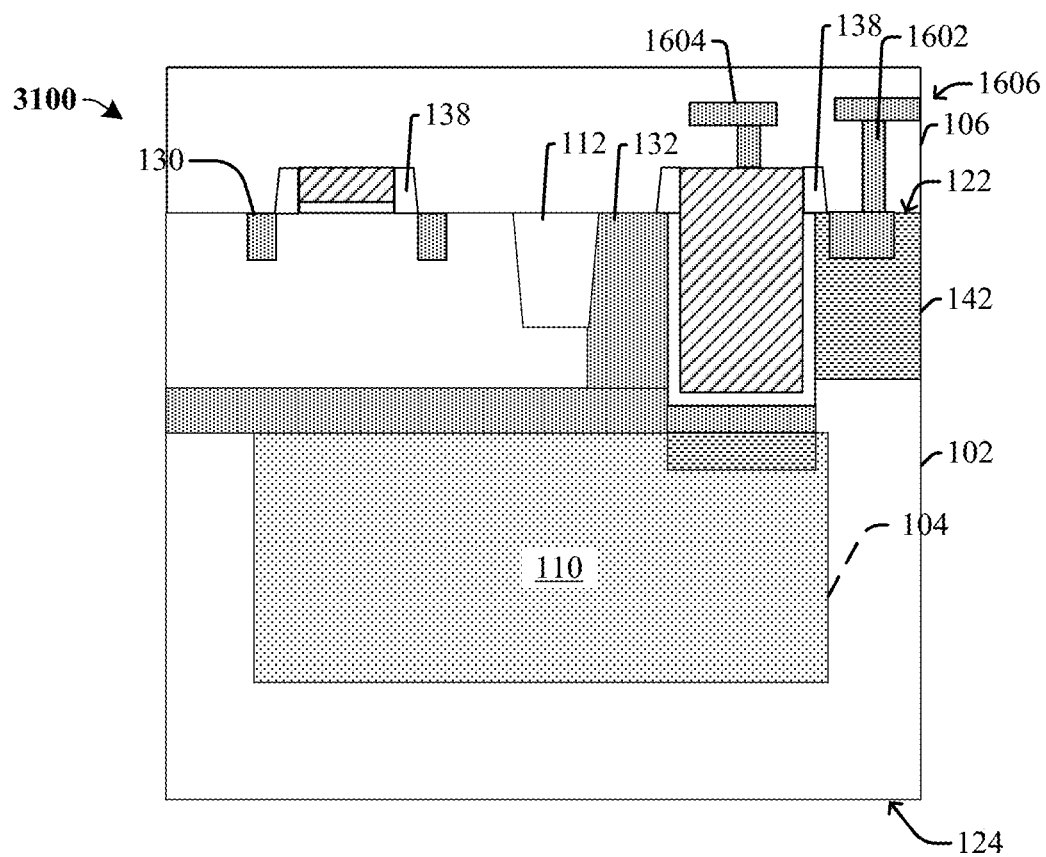

As shown in cross-sectional view 3100 of FIG. 31, a BEOL metallization stack 1606 comprising a plurality of metal interconnect layers arranged within an ILD layer 106 can be formed over the front-side 122 of the substrate 102. In some embodiments, the BEOL metallization stack 1606 may be formed by forming the ILD layer 106, which comprises one or more layers of ILD material, over the front-side 122 of the substrate 102. The ILD layer 106 is subsequently etched to form via holes and/or metal trenches. The via holes and/or metal trenches are then filled with a conductive material to form the plurality of metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example. The ILD layer can be then bonded to a handle substrate (not shown) or any other functional substrate for stacked structure. In some embodiments, the bonding process may use an intermediate bonding oxide layer arranged between the ILD layer and the handle substrate. In some embodiments, the bonding process may comprise a fusion bonding process.

Figure 32:
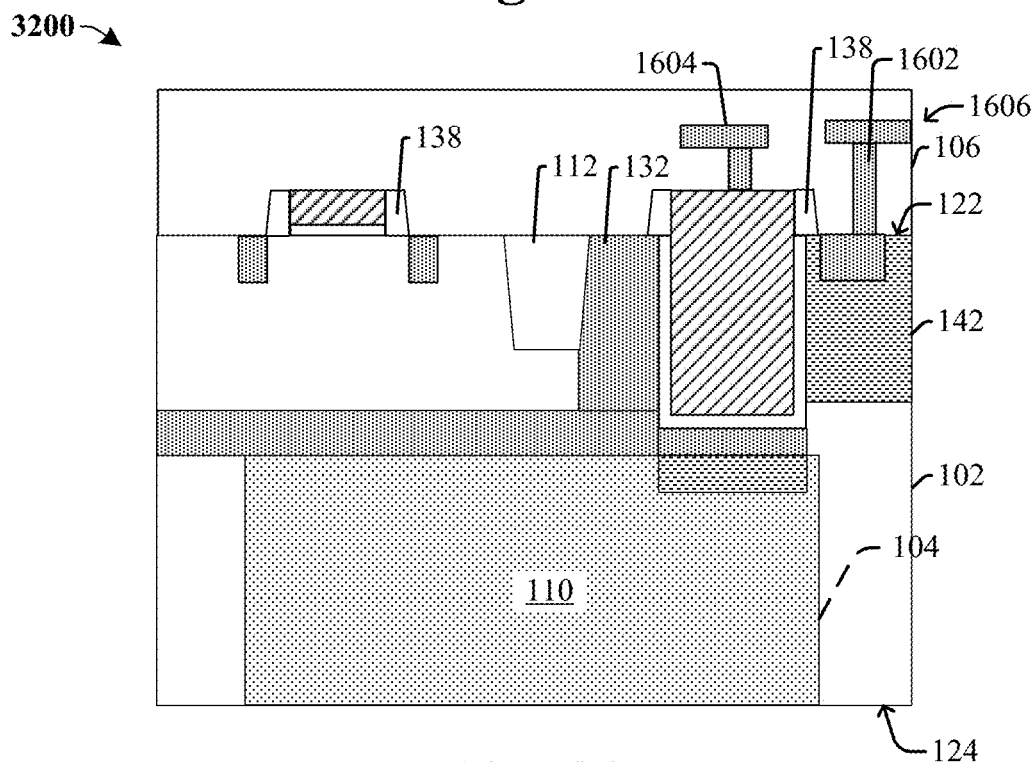

As shown in cross-sectional view 3200 of FIG. 32, the substrate 102 is flipped over for further processing on a back-side 124 that is opposite to the front-side 122. The substrate 102 is thinned down and a back-side of the photodiode doped region may be exposed. As an example, the thinned substrate 102 may have a thickness in a range of from about 2 μm to about 10 μm. In some embodiments, the substrate 102 may be thinned by etching the back-side 124 of the semiconductor substrate. In other embodiments, the substrate 102 may be thinned by mechanical grinding the back-side 124 of the semiconductor substrate.

Figure 33:
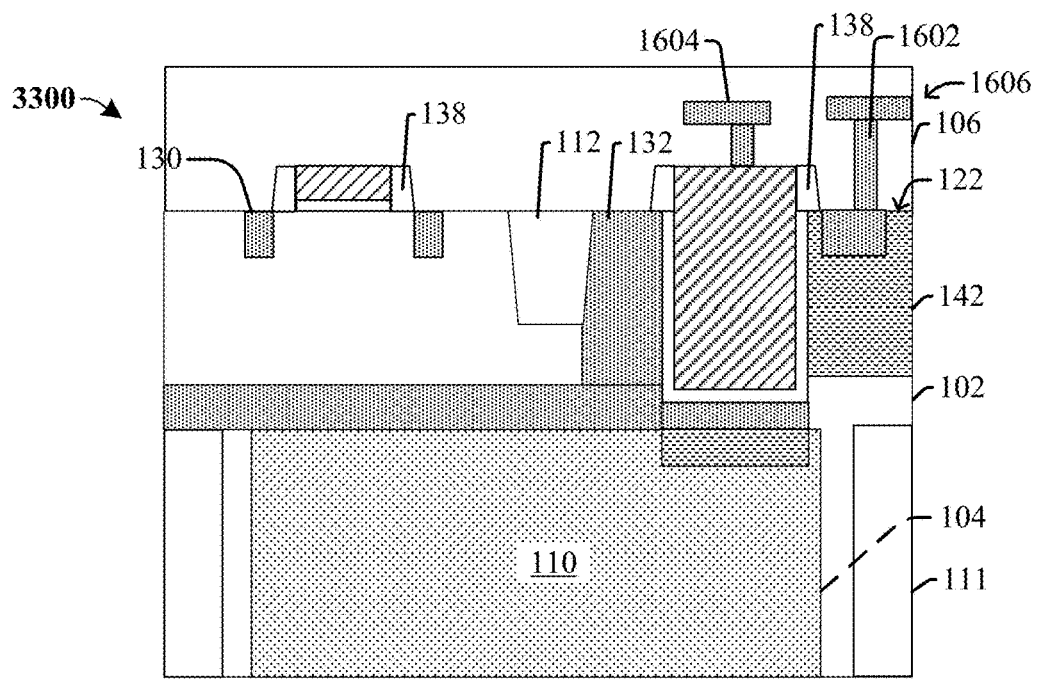

As shown in cross-sectional view 3300 of FIG. 33, the substrate 102 is selectively etched to form deep trench isolation structures within the back-side 124 of the substrate 102. In some embodiments, the substrate 102 may be etched by forming a masking layer onto the back-side 124 of the substrate 102. The substrate 102 is then exposed to an etchant in regions not covered by the masking layer. The etchant etches the substrate 102 to form deep trenches 1802 extending to a position reaching and/or passing a bottom surface of the STI structure 112. A dielectric fill layer is formed to fill the deep trenches.

Figure 34:
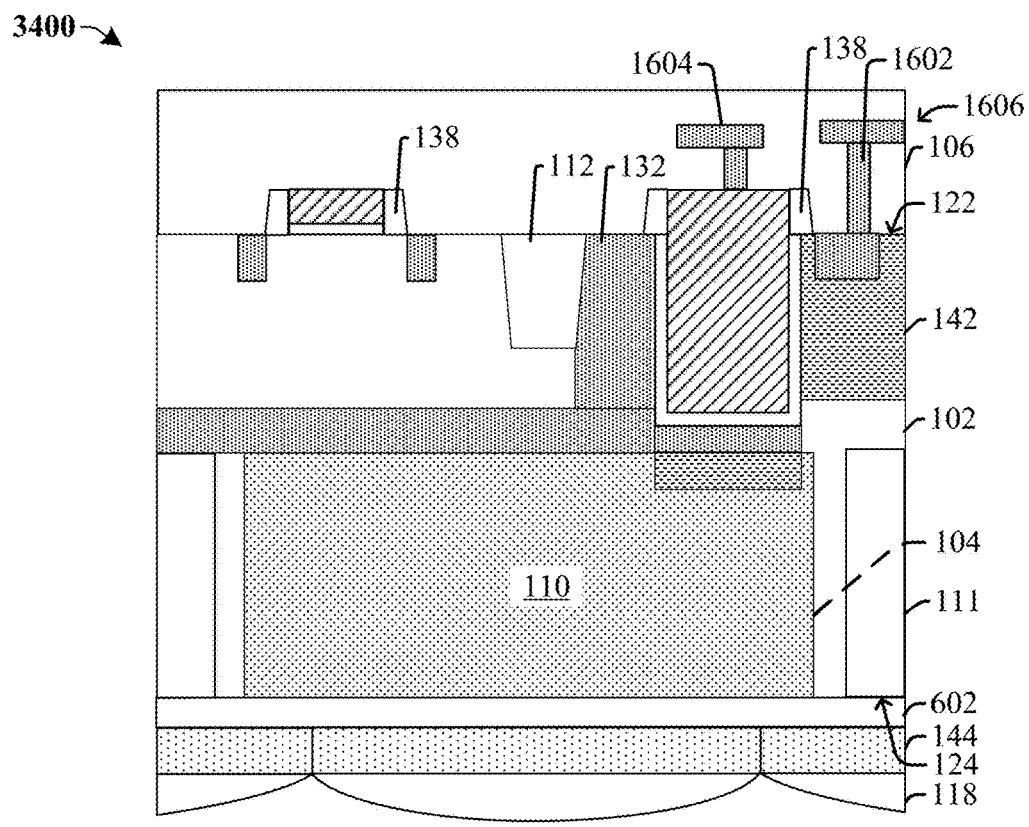

As shown in cross-sectional view 3400 of FIG. 34, a plurality of color filters 144 can be subsequently formed over the back-side 124 of the substrate 102. An antireflection layer 602 may be formed between the color filters 144 and the substrate 102. In some embodiments, the plurality of color filters 144 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. A plurality of micro-lenses 118 may be formed over the plurality of color filters. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses are then formed by selectively etching the micro-lens material according to the micro-lens template.

Figure 35:
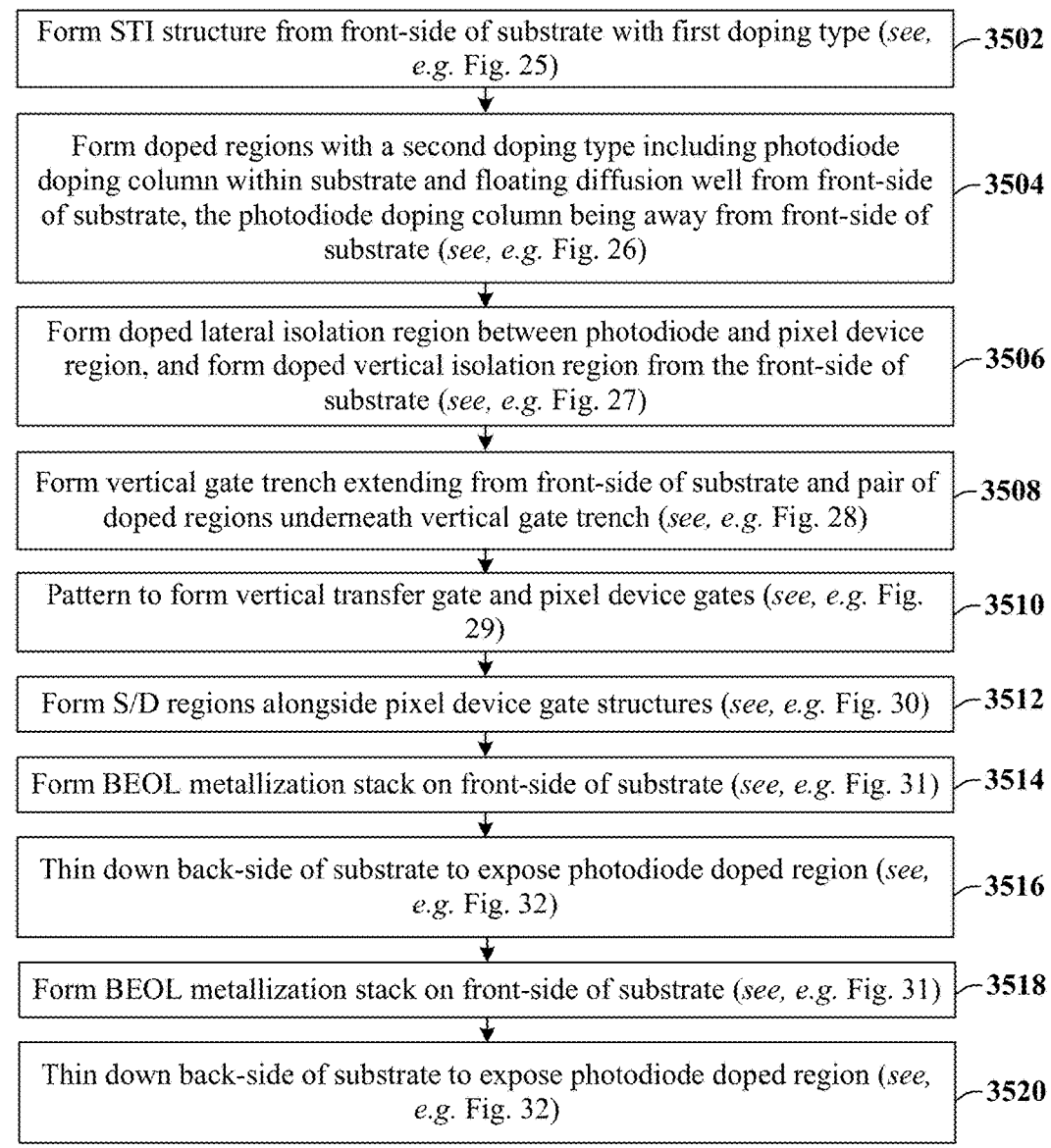
FIG. 35 illustrates a flow diagram of some embodiments of a method of forming a CMOS image sensor having a pixel device on a photodiode structure.

FIG. 35 illustrates a flow diagram of some embodiments of a method 3500 of forming a CMOS image sensor having a doped isolation structure separating a photodiode and a pixel device. While disclosed method 3500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3502, a substrate is provided. A doping well with the first doping type (e.g. p-type) may be formed within the epitaxial layer as a first region of a P-N junction photodiode to be formed. Then, a first shallow trench isolation (STI) structure and a second STI structure are formed from a front-side of a substrate. FIG. 25 illustrates a cross-sectional view corresponding to some embodiments corresponding to act 3502.

At act 3504, a first dopant is implanted into the substrate to form doped regions including a photodiode doping column within the substrate and a floating diffusion well from a front-side of the substrate. FIG. 26 illustrates a cross-sectional view corresponding to some embodiments corresponding to act 3504.

At act 3506, the doped lateral isolation region is formed between photodiode and pixel device region, and the doped vertical isolation region is formed from the front-side of substrate. FIG. 27 illustrates a cross-sectional view corresponding to some embodiments corresponding to act 3506.

At act 3508, vertical gate trench is formed extending from the front-side of the substrate. A pair of doped regions may be formed underneath the vertical gate trench. FIG. 28 illustrates a cross-sectional view corresponding to some embodiments corresponding to act 3508.

At act 3510, a transfer gate electrode and gate structures for pixel devices such as a source follower transistor, a reset transistor, and/or a row select transistor are formed over the front-side of the substrate. The gate structures for pixel devices are formed between the STI structure. The gate structures may be formed by depositing a gate dielectric film and a gate electrode film over the substrate. The gate dielectric film and the gate electrode film are subsequently patterned to form a gate dielectric layer and a gate electrode. Sidewall spacers may be formed on the outer sidewalls of the gate electrode. FIG. 29 illustrates a cross-sectional view corresponding to some embodiments corresponding to act 3510.

At act 3512, a plurality of implantation process is performed. Implantation processes are performed within the front-side of the substrate to form a floating diffusion well along one side of the transfer gate electrode. S/D regions are formed alongside the gate structures for pixel devices. FIG. 30 illustrates a cross-sectional view corresponding to some embodiments corresponding to act 3512.

At act 3514, a BEOL metallization stack comprising a plurality of metal interconnect layers arranged within an ILD layer can be formed over the front-side of the substrate. FIG. 31 illustrates a cross-sectional view corresponding to some embodiments corresponding to act 3514.

At act 3516, the substrate is flipped over for further processing on a back-side that is opposite to the front-side. The substrate is thinned down and a back-side of the P-N junction photodiode doping column may be exposed. FIG. 32 illustrates a cross-sectional view corresponding to some embodiments corresponding to act 3516.

At act 3518, the substrate is selectively etched to form deep trench isolation structures within the back-side of the substrate. FIG. 33 illustrates a cross-sectional view corresponding to some embodiments corresponding to act 3518.

At act 3520, color filters and micro-lenses are formed over the back-side of the semiconductor substrate. FIG. 34 illustrates a cross-sectional view corresponding to some embodiments corresponding to act 3520.

Therefore, the present disclosure relates to a CMOS image sensor having a doped isolation structure separating a photodiode and a pixel device, and an associated method of formation. The DTI structure comprises a doped layer doped layer lining a sidewall surface of a deep trench and a dielectric layer filling a remaining space of the deep trench. By forming the disclosed pixel device directly overlying the DTI structure, short channel effect is reduced because of the room for pixel device and also because the insulation layer underneath the pixel device. Thus higher device performance can be realized, and the blooming and crosstalk are reduced.

In some embodiments, the present disclosure relates to a CMOS image sensor. The image sensor comprises a substrate having a front-side and a back-side opposite to the front-side. A photodiode doped region with a second doping type opposite to the first doping type is disposed within the substrate. A vertical transfer gate electrode extends vertically from the front-side of the substrate to a first position within the substrate and is separated from the substrate by a gate dielectric. A doped lateral isolation region is disposed on the photodiode doped region. A pixel device well is disposed on the doped lateral isolation region. A pixel device is disposed on the pixel device well at the front-side of the substrate, the pixel device comprising a gate electrode disposed over the substrate and a pair of source/drain (S/D) regions disposed within the substrate In some alternative embodiments, the present disclosure relates to a CMOS image sensor. The image sensor comprises a p-type substrate having a front-side and a back-side opposite to the front-side. An n-type photodiode region is disposed within and in direct contact with the p-type substrate. A vertical transfer gate electrode extends vertically from the front-side of the p-type substrate to a first position within the p-type substrate and is separated from the p-type substrate by a gate dielectric. A p-type lateral isolation region is disposed on the n-type photodiode region. A p-type vertical isolation region vertically extends from the front-side of the p-type substrate and reaches on the p-type lateral isolation region.

In yet other embodiments, the present disclosure relates to method of forming an image sensor. The method comprises forming a shallow trench isolation (STI) structure at a peripheral of a pixel region from a front-side of a substrate and forming a photodiode doped region of a photodiode of the pixel region from the front-side of the substrate. The method further comprises forming a doped lateral isolation region and a doped vertical isolation region on the photodiode doped region and the substrate and forming a vertical transfer gate structure aside of the doped vertical isolation region and a floating diffusion well at one side of the transfer gate opposite to the doped vertical isolation region. The method further comprises forming a pixel device on the front-side of the substrate on one side of the doped vertical isolation region opposite to the vertical transfer gate structure and forming a deep trench isolation (DTI) structure from a back-side of the substrate extending into the substrate, surrounding the photodiode doped region, and separated from the photodiode doped region by the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS image sensor, comprising:
   a substrate with a first doping type and having a front-side and a back-side opposite to the front-side;
   a photodiode doped region with a second doping type opposite to the first doping type and disposed within the substrate;
   a vertical transfer gate electrode extending vertically from the front-side of the substrate to a first position within the substrate and separated from the substrate by a gate dielectric;
   a doped vertical isolation region vertically extending along the vertical transfer gate electrode;
   a doped lateral isolation region of continuous doping disposed on the photodiode doped region, directly contacting the doped vertical isolation region, and extending along a direction laterally opposite to the vertical transfer gate electrode;
   a pixel device well disposed on the doped lateral isolation region, wherein the pixel device well has a doping concentration less than that of the doped vertical isolation region; and
   a pixel device disposed on the pixel device well at the front-side of the substrate, the pixel device comprising a gate electrode disposed over the substrate and a pair of source/drain (S/D) regions disposed within the substrate.

2. The CMOS image sensor of claim 1, wherein the doped vertical isolation region and the doped lateral isolation region separate the pixel device well from the photodiode doped region.

3. The CMOS image sensor of claim 2, wherein the doped vertical isolation region abuts a sidewall of the gate dielectric and has a top surface aligned with a top surface of the pixel device well.

4. The CMOS image sensor of claim 2, further comprising:
   a floating diffusion well disposed within the substrate on another side of the vertical transfer gate electrode opposite to the doped vertical isolation region.

5. The CMOS image sensor of claim 4, wherein the floating diffusion well has a doping concentration decreases in gradient from a top surface at the front-side of the substrate to a bottom surface away from the front-side of the substrate.

6. The CMOS image sensor of claim 1, further comprising:
a shallow trench isolation (STI) structure between and contacting the pixel device and the doped vertical isolation region, extending from the front-side of the substrate to a position within the pixel device well.

7. The CMOS image sensor of claim 6, wherein the STI structure has a bottom surface locating at a position shallower within the substrate than that of the doped lateral isolation region.

8. The CMOS image sensor of claim 6, wherein the S/D regions of the pixel device have bottom surfaces locating at a position of the substrate higher than the bottom surface of the STI structure.

9. The CMOS image sensor of claim 1, further comprising:
a first doped region surrounding a lower portion of the vertical transfer gate electrode; and
a second doped region disposed underneath and abutting the first doped region;
wherein the second doped region has a doping type opposite to the first doped region.

10. The CMOS image sensor of claim 9, wherein the first doped region and the second doped region each has a sidewall surface vertically aligned with a sidewall surface of the photodiode doped region.

11. The CMOS image sensor of claim 1, wherein the doped lateral isolation region and the pixel device well have the first doping type.

12. The CMOS image sensor of claim 1, wherein the pixel device is a source follower transistor, a reset transistor, or a row select transistor.

13. The CMOS image sensor of claim 1, wherein the photodiode doped region and the substrate meet at an interface of a P-N junction and configured to convert a radiation to an electrical signal.

14. The CMOS image sensor of claim 13, wherein the radiation enters from the back-side of the substrate.

15. The CMOS image sensor of claim 1, further comprising:
a deep trench isolation (DTI) structure of a dielectric fill layer surrounding the photodiode doped region and separated from the photodiode doped region by the substrate;
wherein the doped lateral isolation region directly contacts an upper surface of the DTI structure.

16. A CMOS image sensor, comprising:
a p-type substrate having a front-side and a back-side opposite to the front-side;
an n-type photodiode region disposed within and in direct contact with the p-type substrate;
a vertical transfer gate electrode extending vertically from the front-side of the p-type substrate to a first position within the p-type substrate and separated from the p-type substrate by a gate dielectric;
a p-type lateral isolation region disposed on the n-type photodiode region;
a p-type pixel device well disposed on the p-type lateral isolation region;
a p-type vertical isolation region vertically extending from the front-side of the p-type substrate and reaching on the p-type lateral isolation region, wherein the p-type vertical isolation region has a doping concentration greater than that of the p-type pixel device well; and
a deep trench isolation (DTI) structure surrounding the n-type photodiode region;
wherein the p-type lateral isolation region directly contacts and covers a top surface of the DTI structure.

17. The CMOS image sensor of claim 16, wherein the DTI structure is separated from the n-type photodiode region by the p-type substrate;
wherein the p-type lateral isolation region is in direct contract with and laterally extends along top surfaces of the n-type photodiode region, the p-type substrate, and the DTI structure of a dielectric fill layer.

18. The CMOS image sensor of claim 16, wherein the p-type lateral isolation region and the p-type vertical isolation region have a substantial same doping concentration that is more than 10 times greater than that of the p-type substrate.

19. The CMOS image sensor of claim 16, wherein the p-type lateral isolation region directly contacts the p-type vertical isolation region and extends along a direction laterally opposite to the vertical transfer gate electrode.

20. A method of forming an image sensor, comprising:
forming a shallow trench isolation (STI) structure at a peripheral of a pixel region from a front-side of a substrate;
forming a photodiode doped region of a photodiode of the pixel region from the front-side of the substrate;
forming a doped lateral isolation region and a doped vertical isolation region on the photodiode doped region, along the STI structure, and within the substrate, wherein the doped lateral isolation region and the doped vertical isolation region separate the photodiode doped region from the pixel region thereabove;
forming a vertical transfer gate structure aside of the doped vertical isolation region and a floating diffusion well at one side of the vertical transfer gate structure opposite to the doped vertical isolation region;
forming a pixel device on the front-side of the substrate on one side of the doped vertical isolation region opposite to the vertical transfer gate structure; and
forming a deep trench isolation (DTI) structure of a dielectric fill layer from a back-side of the substrate extending into the substrate, surrounding the photodiode doped region, and reaching to a bottom surface of the doped lateral isolation region.

* * * * *